US012800442B2

(12) United States Patent
Takano et al.

(10) Patent No.: US 12,800,442 B2
(45) Date of Patent: Nov. 17, 2026

(54) MANAGEMENT DEVICE FOR POWER TRANSMISSION MECHANISM, MANAGEMENT METHOD FOR POWER TRANSMISSION MECHANISM, AND MANAGEMENT SYSTEM

(71) Applicant: Hitachi Industrial Equipment Systems Co., Ltd., Tokyo (JP)

(72) Inventors: Yuuri Takano, Tokyo (JP); Satoru Kaneko, Tokyo (JP); Kenta Deguchi, Tokyo (JP); Hironori Ohashi, Tokyo (JP); Yutaka Matsumoto, Tokyo (JP)

(73) Assignee: Hitachi Industrial Equipment Systems Co., Ltd., Tokyo (JP)

( * ) Notice: Subject to any disclaimer, the term of this patent is extended or adjusted under 35 U.S.C. 154(b) by 399 days.

(21) Appl. No.: 18/696,100

(22) PCT Filed: May 24, 2022

(86) PCT No.: PCT/JP2022/021182

§ 371 (c)(1),
(2) Date: Mar. 27, 2024

(87) PCT Pub. No.: WO2023/119686

PCT Pub. Date: Jun. 29, 2023

(65) Prior Publication Data

US 2024/0385082 A1 Nov. 21, 2024

(30) Foreign Application Priority Data

Dec. 24, 2021 (JP) ................................ 2021-210040

(51) Int. Cl.

| | |
|---|---|
| ***G01M 99/00*** | (2011.01) |
| ***G01R 31/34*** | (2020.01) |
| ***G05B 23/02*** | (2006.01) |

(52) U.S. Cl.
CPC ........... *G01M 99/005* (2013.01); *G01R 31/34* (2013.01); *G05B 23/0224* (2013.01)

(58) Field of Classification Search
CPC .. G01M 99/005; G01R 31/34; G05B 23/0224
See application file for complete search history.

(56) References Cited

U.S. PATENT DOCUMENTS

| | | | | |
|---|---|---|---|---|
| 7,070,530 B2 * | 7/2006 | Ai | .......................... | B60K 6/445 477/17 |
| 8,112,192 B2 * | 2/2012 | Heap | ...................... | B60K 6/365 180/65.21 |

(Continued)

FOREIGN PATENT DOCUMENTS

| | | |
|---|---|---|
| EP | 3 633 851 A1 | 4/2020 |
| EP | 4 156 502 A1 | 3/2023 |

(Continued)

OTHER PUBLICATIONS

International Preliminary Report on Patentability (PCT/IB/338 & PCT/IB/373) issued in PCT Application No. PCT/JP2022/021182 dated Jul. 4, 2024, including English translation of document C2 (Japanese-language Written Opinion (PCT/ISA/237), filed on Mar. 27, 2024) (8 pages).

(Continued)

*Primary Examiner* — Elias Desta
(74) *Attorney, Agent, or Firm* — Crowell & Moring LLP

(57) ABSTRACT

A management device that can sense abnormality (deterioration) detection on a power transmission mechanism with higher precision and probability is implemented. A management device 30 for a power transmission mechanism that transmits a driving force from an electric motor 13 to a load-side device 12 includes a current acquiring section that acquires a current value of the electric motor 13 per unit process in which the power transmission mechanism is driven, a feature calculating section 121 that divides the unit (Continued)

process into multiple zones and calculates an average current value obtained by averaging the current value of each of the zones, and a diagnosis section 122 that executes abnormality detection. The diagnosis section 122 calculates a state amount estimation value on the basis of the average current value of the multiple zones, and executes abnormality sensing in the unit process on the basis of the state amount estimation value.

13 Claims, 15 Drawing Sheets

(56) References Cited

U.S. PATENT DOCUMENTS

| | | | | |
|---|---|---|---|---|
| 8,167,773 | B2 * | 5/2012 | Kothari | B60W 10/08 180/65.265 |
| 10,093,352 | B2 * | 10/2018 | Mori | B62D 5/0484 |
| 2003/0009311 | A1 | 1/2003 | Ushiku et al. | |
| 2020/0284690 | A1 | 9/2020 | Kanemaru et al. | |

FOREIGN PATENT DOCUMENTS

| | | | |
|---|---|---|---|
| JP | 8-146057 | A | 6/1996 |
| JP | 11-326147 | A | 11/1999 |
| JP | 2002-285974 | A | 10/2002 |
| JP | 2009-45510 | A | 3/2009 |
| JP | 2017-175775 | A | 9/2017 |
| JP | 2019-123006 | A | 7/2019 |
| JP | 2021-136779 | A | 9/2021 |
| WO | WO 2018/109993 | A1 | 6/2018 |
| WO | WO 2018/220751 | A1 | 12/2018 |
| WO | WO 2021/234889 | A1 | 11/2021 |

OTHER PUBLICATIONS

International Search Report (PCT/ISA/210) issued in PCT Application No. PCT/JP2022/021182 dated Aug. 9, 2022 with English translation (7 pages).

Japanese-language Written Opinion (PCT/ISA/237) issued in PCT Application No. PCT/JP2022/021182 dated Aug. 9, 2022 with English translation (9 pages).

* cited by examiner

MANAGEMENT DEVICE FOR POWER TRANSMISSION MECHANISM, MANAGEMENT METHOD FOR POWER TRANSMISSION MECHANISM, AND MANAGEMENT SYSTEM

TECHNICAL FIELD

The present invention relates to a management device for a power transmission mechanism, a management method for a power transmission mechanism, and a management system.

BACKGROUND ART

For example, various kinds of industrial equipment such as an injection molding machine and press apparatus can be cited as apparatus in which power is supplied from a power source to some kind of load-side device through a power transmission mechanism. When description is made by taking the injection molding machine as an example, equipment is known that obtains an optional molded object by injecting a soft viscous material such as a resin, metal fiber, or a mixed material of them into a mold in which a predetermined shape is made, through an optional power transmission mechanism with use of a rotating electrical machine (motor) as a power source.

As one example, the injection molding machine will be cited and the configuration and operation thereof will be described. The injection molding machine is configured to obtain a desired molded object by transmitting, by a power transmission mechanism, power of an electric motor as a drive source (in some cases, rotational force or horizontal power like a linear motor) as power for injection into a mold for injection molding and injecting a soft viscous component into a predetermined mold. As a more specific example, an injection shaft integrated with a nut component that is mechanically connected directly or indirectly to a power conversion mechanism such as a ball screw that converts a rotational drive force of the electric motor to linear motion, and screws to linear power of the ball screw that is such a power transmission mechanism is configured to press the soft viscous component against the predetermined mold.

In apparatus typified by the injection molding machine and the press apparatus, managing an abnormality of the whole of a load-side device with a drive source (drive source itself, workpiece mechanism of the load-side device, and so forth) is an important factor that deeply affects the quality of the final molded object. Furthermore, the abnormality causes overload of equipment or a part, and causes also an environmental problem such as the energy efficiency and a problem in terms of business, such as manufacturing stop due to damage to equipment. Thus, it can be said that managing the abnormality of equipment is an issue whose social influence is also large.

Patent document 1 discloses a technique to estimate the state of equipment as a technique relating to such abnormality detection. Specifically, a technique is disclosed that includes an electric motor as a drive source and motor control means that controls it, creates motor control internal values of the motor control means, and estimates an abnormality of equipment through comparison with them. It is a technique that can sense the deterioration of the equipment (load-side device and workpiece component that accompanies it) by monitoring the internal values of the motor control.

Moreover, patent document 2 discloses an abnormality diagnosis device of a power transmission mechanism that executes transmission of power from an electric motor as a drive source, and an abnormality diagnosis method thereof. More specifically, in patent document 2, in a configuration in which the power of the electric motor is connected to a machine facility as a load through a pulley belt and a gear chain, an abnormality of the pulley belt and the gear chain is diagnosed by obtaining a current spectrum waveform from a value transmitted from a current sensor connected to the electric motor, and counting the number of sideband waves other than ones in the frequency bands of the pulley belt and the gear chain generated in association with the rotation speed, on the basis of a spectral peak calculated by analysis from the current spectrum waveform.

In apparatus typified by the injection molding machine and the press apparatus, the power transmission mechanism functions as an intermediary between the power source and an element on which a load is directly generated, such as a mold. Thus, maintenance of the performance of the power transmission mechanism deeply affects the quality (degree of perfection) of a molded object that is the final product, and it is important to manage it.

PRIOR ART DOCUMENT

Patent Documents

Patent Document 1: PCT Patent Publication No. WO2018/220751
Patent Document 2: PCT Patent Publication No. WO2018/109993

SUMMARY OF THE INVENTION

Problem to be Solved by the Invention

Here, consideration will be made about abnormality (deterioration) detection of the power transmission mechanism. Regarding the load-side device, the way of application of a load thereto is not uniform in many cases and a part at which the load applied to the power transmission mechanism becomes high and a part at which the load becomes low exist in a mixed manner in many cases. That is, a ball screw, pulley belt, gear chain, or the like is cited as an example of the power transmission mechanism, and a bias is caused in the place at which deterioration occurs in them depending on the load status of the load-side device.

Regarding this point, in the abnormality diagnosis technique of the power transmission mechanism disclosed by the above-described patent document 2, in which an abnormality of the power transmission mechanism is sensed by monitoring the spectral peal from the current spectrum waveform and the sideband waves that accompany it, a problem remains that the sensitivity of sensing of an abnormality lowers when the deterioration of the power transmission mechanism is small or when the deterioration is at the initial stage. That is, when the current spectrum of the electric motor is merely analyzed with respect to the deterioration of the power transmission mechanism, an abnormal value attributed to the deterioration of the power transmission mechanism appears only as an extremely slight swing in many cases, and distinguishing whether this swing is temporary current noise in normal times or a swing attributed to an abnormality involves difficulty. Thus, with only monitoring of the state of the mere current spectrum, an issue remains in the precision of abnormality detection.

Furthermore, abnormal values vary compared with normal values depending on the deterioration of the power transmission mechanism, and it is thought that it is also possible to execute deterioration determination by determining also this variation.

Thus, a technique that senses abnormality detection on the power transmission mechanism with higher precision and probability is desired.

Means for Solving the Problem

In order to solve the above-described problem, configurations are made as follows.

A management device for a power transmission mechanism that transmits a driving force from an electric motor to a load-side device includes a current acquiring section that acquires a current value of the electric motor per unit process in which the power transmission mechanism is driven, a feature calculating section that divides the unit process into a plurality of zones, and calculates an average current value obtained by averaging the current value of each of the zones, and a diagnosis section that executes abnormality detection. The diagnosis section calculates a state amount estimation value on the basis of the average current value of the plurality of zones and executes abnormality sensing in the unit process on the basis of the state amount estimation value.

Furthermore, a management method for a power transmission mechanism that transmits a driving force from an electric motor to a load-side device includes a current acquisition step of acquiring a current value per unit process in which the power transmission mechanism is driven, an average current value calculation step of dividing the unit process into a plurality of zones and calculating an average current value obtained by averaging the current value of each of the zones, and an abnormality detection step of executing abnormality detection. The abnormality detection step calculates a state amount estimation value on the basis of the average current value of the plurality of zones and executes abnormality sensing in the unit process on the basis of the state amount estimation value.

Advantages of the Invention

According to the present invention, a management device, a management method, and a management system that can sense abnormality (deterioration) detection on a power transmission mechanism with higher precision and probability can be implemented.

In particular, according to the present invention, there is an effect of improvement in the precision and the probability with which sensing as an abnormality is allowed even when an abnormality (deterioration) of the power transmission mechanism is small or even when an abnormality (deterioration) is at the initial stage.

Other problems, configurations, and effects of the present invention will become apparent from the following description.

MODES FOR CARRYING OUT THE INVENTION

Modes for carrying out the present invention will be described in detail below with use of the drawings.

EMBODIMENT EXAMPLE

Embodiment Example 1

Figure 1:
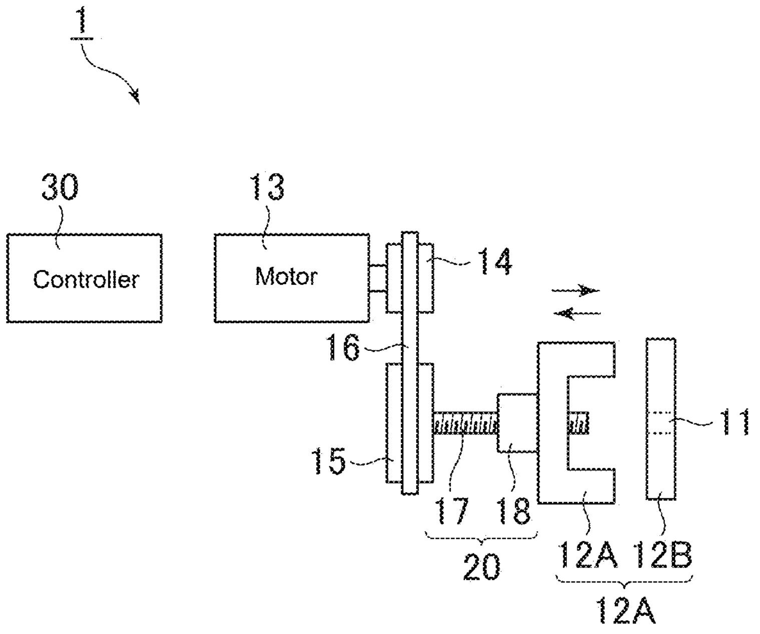
FIG. 1 is a schematic diagram illustrating the mechanical configuration of an injection molding machine according to an embodiment to which the present invention is applied.

In FIG. 1, a partial outline configuration of an injection molding machine 1 including a management device (controller 30) for a power transmission mechanism to which the present invention is applied is schematically illustrated. Although description will be made by taking the injection molding machine as an example in the present embodiment, the present invention is not limited thereto and can be applied to apparatus as long as it is apparatus that transmits a driving force of a drive source to a load side through a power transmission mechanism, such as press apparatus and cutting apparatus.

First, the mechanical configuration and operation of the injection molding machine 1 will be described. The injection molding machine 1 converts rotation of a plurality of motors to linear motion to drive a single linear movement component and, at this time, synchronously operates the plurality of motors in such a manner that the progression positions thereof are aligned. The configuration to which the present invention can be applied may be a configuration in which a driving force is supplied to a plurality of power transmission mechanisms through gears by a single motor or a configuration in which a driving force is supplied to a single power transmission mechanism by a single motor.

In the injection molding machine 1, a molten resin is poured from a hole 11 provided in a fixed mold 12B of a mold 12, and a resin molded object according to the shape of a gap that exists between the movable mold 12A and the fixed mold 12B can be fabricated. The mold 12 having the movable mold 12A and the fixed mold 12B is one example of a load-side device.

The mold includes the fixed mold 12B fixed to a casing and the movable mold 12A that moves forward and rearward. The injection molding machine 1 includes a motor 13 that is an electric motor, a pulley 14 made to adhere to an output shaft of the motor 13, a driven pulley 15, a timing belt 16 that transmits rotation of the drive pulley 14 to the driven pulley 15, a ball screw mechanism 20 as a power transmission mechanism that converts rotation of the pulley 15 to linear motion and transmits the linear motion to the movable mold 12A, and the controller 30.

The motor 13 includes an encoder (not illustrated) that outputs a motor position signal S2 indicating the progression position thereof (equivalent to the progression position of the ball screw mechanism 20). The injection molding machine 1 controls driving of the motor 13 through reception, by the controller 30, of a speed command signal S0 from an upper-level device that is not illustrated.

When the motor 13 is driven, the rotation thereof is transmitted to a screw shaft 17 of the ball screw mechanism 20 through the drive pulley 14, the timing belt 16, and the driven pulley 15, and a nut part 18 that screws to grooves thereof with the interposition of balls converts the rotational force to linear motion. The movable mold 12A is integrated with or mechanically coupled to the nut part 18, and the movable mold 12A also linearly moves according to the linear motion of the nut part 18. As a result, the movable mold 12A gets closer to or further away from the fixed mold 12B. A resin is poured and molded after the movable mold 12A is brought into contact with the fixed mold 12B. Then, after having solidified through cooling, the molded object is taken out by separating the movable mold 12A from the fixed mold 12B.

For example, the controller 30 is configured to have a microcomputer for embedded equipment including CPU, ROM, RAM, EEPROM, various I/O interfaces, and so forth, and executes various functions by cooperation with a program. The controller 30 executes control of the injection molding machine 1 to execute control of the whole of the molding processes such as plasticization operation, injection operation, mold opening-closing operation, and ejection operation. The present invention is not limited to the present embodiment and part thereof may be configured by an analog circuit.

Subsequently, the controller 30 will be described as a functional configuration.

Figure 2:
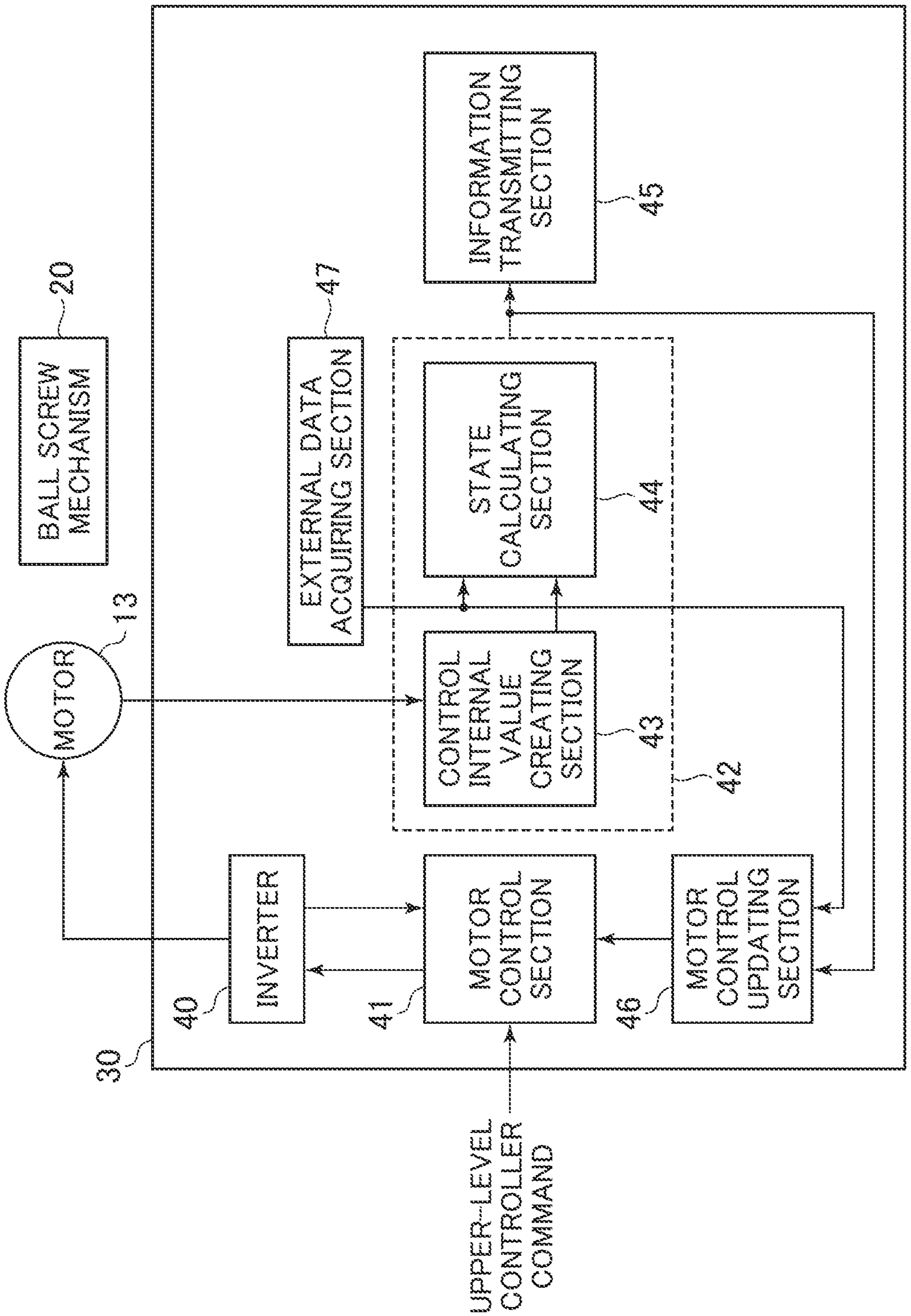
FIG. 2 is a schematic diagram illustrating the functional configuration of the injection molding machine according to the present embodiment.

In FIG. 2, a functional block diagram of the controller 30 is schematically illustrated.

An inverter 40 is controlled by a motor control section 41 to which a commonly called vector control system is applied. The motor control section 41 acquires pieces of information such as the motor current, the motor voltage, position information of a rotor, and the rotation speed from the inverter 40 or the motor 13, and creates a voltage command value for driving the motor 13 on the basis of these pieces of information in response to a command from an upper-level controller. Then, the motor control section 41 gives the created voltage command value to the inverter 40.

An external data acquiring section 47 is configured from a sensor or the like installed on a component other than the motor 13 and the inverter 40, and acquires the temperature of the equipment, the ambient temperature, an upper-level command value of the equipment, and so forth.

A state estimating section 42 includes a control internal value creating section 43 that creates internal values of the motor control, and a state calculating section 44 that calculates features and a state amount relating to the injection molding machine 1 on the basis of the internal values of the motor control created by the control internal value creating section 43.

The control internal value creating section 43 creates the internal values of the motor control that are state variables in the motor control section 41 and relate to the state of the injection molding machine 1, on the basis of time-series data acquired by a current sensor, a voltage sensor, and a position sensor independently installed on an input part or an output part of the motor 13 separately from ones for the motor control section 41, and the data acquired by the external data acquiring section 47. The control internal value creating section 43 corresponds to the current acquiring section.

The state calculating section 44 has a state estimation model, and calculates the state amount indicating the state of the equipment system, that is, the state of the equipment itself and the state (quality and so forth) of a manufactured object manufactured by the equipment, by using the state estimation model on the basis of the motor control internal values created by the motor control internal value creating section 43. That is, the data acquired by the above-described respective sensors and the external data acquiring section 47 is input to the state estimating section 42, and the state estimating section 42 creates the internal values of the motor control created from the input data and outputs the state amount calculated based on the created internal values of the motor control or information relating to the state of the injection molding machine 1 indicated by this state amount (hereinafter, referred to as "estimated state"). The estimated state output from the state estimating section 42 is transmitted to an information transmitting section 45 and a motor control updating section 46 to be described later. The information transmitting section 45 is also the display section.

According to the estimated state output from the state estimating section 42, the information transmitting section 45 notifies a worker who uses the equipment system or an administrator of the equipment system of information relating to the state of the injection molding machine 1, for example, features of the equipment itself (deterioration determination of the screw shaft 17 that will be described later, or the like) or information relating to the quality of the manufactured object or a change therein, by a display, sound, lamp, vibration, or the like. This can alleviate the work burden in grasping of the maintenance timing of the equipment, grasping of the status at the time of change in the quality, equipment adjustment work, and so forth.

The motor control updating section 46 changes the motor control section 41, that is, a control command, a control parameter, or control software, on the basis of the estimated state output from the state estimating section 42. For example, when the quality of the manufactured object has changed, the motor control updating section 46 changes the motor control section 41 so as to suppress the change in the quality. This allows automation of adjustment work of the injection molding machine 1 and thus the work burden is alleviated.

Next, further details will be described about the motor control section 41 and the state estimating section 42.

Figure 3:
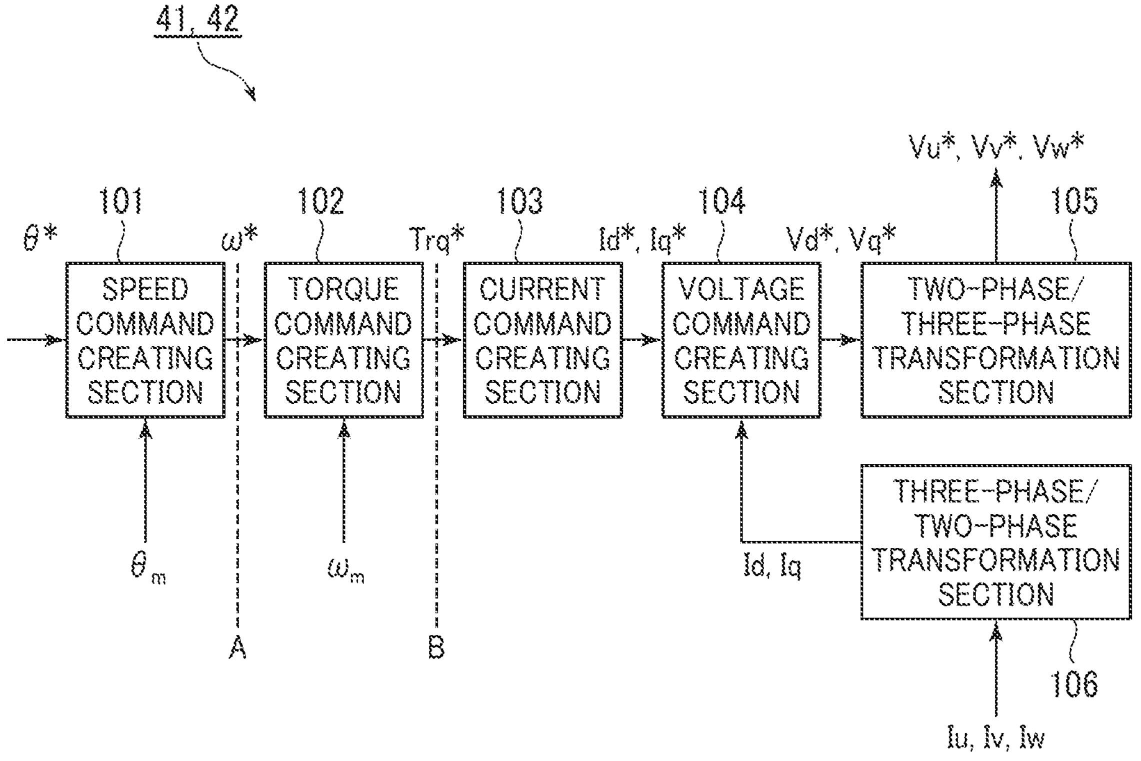
FIG. 3 is a schematic diagram illustrating the functional configuration of a motor control section and a state estimating section according to the present embodiment.

FIG. 3 is a block diagram schematically illustrating the functional configuration of the motor control section 41.

In FIG. 3, a command from the upper-level controller is a position command θ*. However, the command may be a speed (rotation speed) command ω* or a torque command Trq*. When the command from the upper-level controller is the speed (rotation speed) command ω* and the torque command Trq*, the block diagram of the motor control section 41 becomes a block diagram on the right side of a boundary line A in FIG. 3 and a block diagram on the right side of a boundary line B, respectively.

As illustrated in FIG. 3, when the position command θ* is input from the upper-level controller to the motor control section 41, a speed command creating section 101 creates and outputs the speed command ω* on the basis of the difference between a position feedback value $\theta_m$ actually measured by the sensor and the position command value θ*.

When the speed command ω* is input to a torque command creating section 102, the torque command creating section 102 creates and outputs the torque command Trq* on the basis of the difference between a speed (rotation speed) feedback value $\omega_m$ actually measured by the sensor and the speed command ω*.

When the torque command Trq* is input to a current command creating section 103, the current command creating section 103 creates and outputs current commands on the dq-axes in a rotating coordinate system, that is, a d-axis current command Id* and a q-axis current command Iq*, on the basis of the torque command Trq*.

When the d-axis current command Id* and the q-axis current command Iq* are input to a voltage command creating section 104, the voltage command creating section 104 creates and outputs voltage commands on the dq-axes, that is, a d-axis voltage command Vd* and a q-axis voltage command Vq*, on the basis of the difference between a d-axis current feedback value Id and the d-axis current command Id* and the difference between a q-axis current feedback value Iq and the q-axis current command Iq*.

Here, the d-axis current feedback value Id and the q-axis current feedback value Iq are obtained by executing, by a three-phase/two-phase transformation section 106, three-phase/two-phase transformation of a U-phase current feedback value Iu, a V-phase current feedback value Iv, and a W-phase current feedback value Iw of the motor actually measured by the sensor.

When the d-axis voltage command Vd* and the q-axis voltage command Vq* are input to a two-phase/three-phase transformation section 105, the two-phase/three-phase transformation section 105 transforms the d-axis voltage command Vd* and the q-axis voltage command Vq* to a U-phase voltage command Vu*, a V-phase voltage command Vv*, and a W-phase voltage command Vw* and outputs these voltage commands to the inverter 40.

Next, the state estimating section 42 will be described.

As described above (see FIG. 2), the state estimating section 42 includes the control internal value creating section 43 and the state calculating section 44. Description will be made below about each of them with use of drawings.

Figure 4:
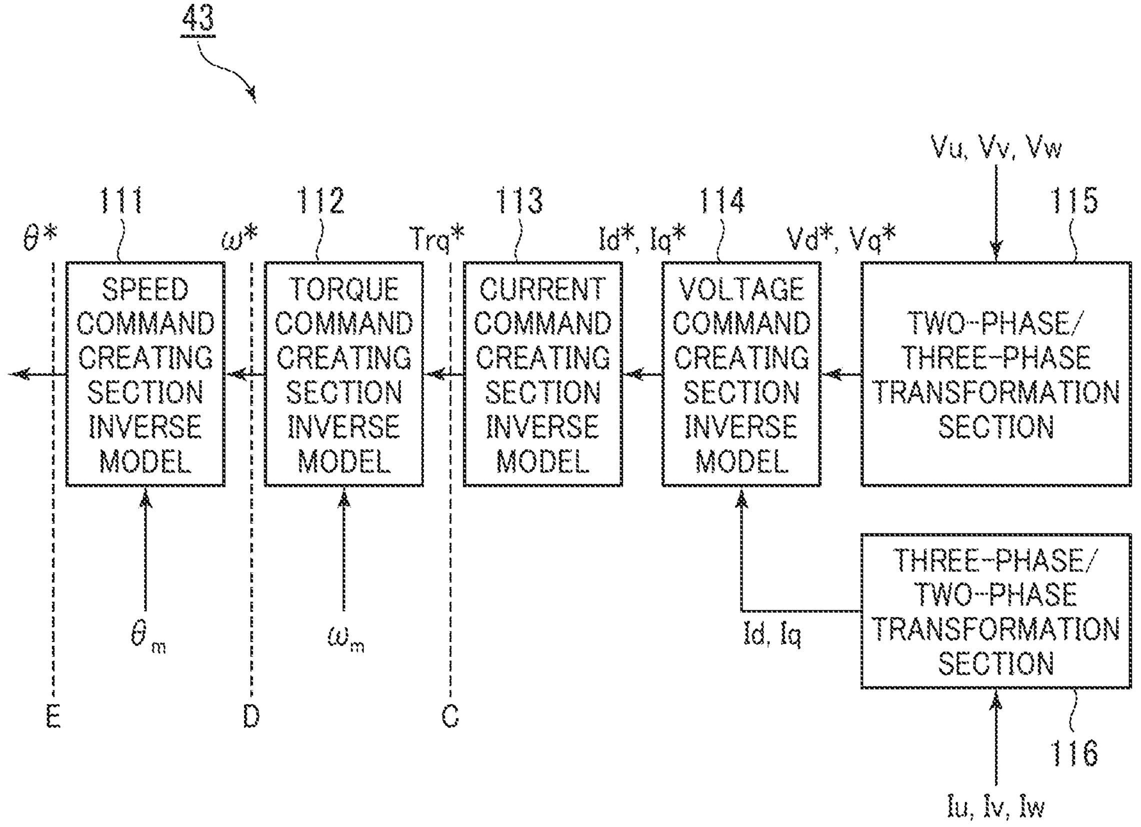
FIG. 4 is a schematic diagram illustrating the functional configuration of a control internal value creating section according to the present embodiment.

In FIG. 4, the functional configuration of the control internal value creating section 43 is schematically illustrated.

As illustrated in FIG. 4, the control internal value creating section 43 is, so to speak, an inverse model of the motor control section 41 illustrated in FIG. 3. That is, corresponding to the speed command creating section 101, the torque command creating section 102, the current command creating section 103, the voltage command creating section 104, the two-phase/three-phase transformation section 105, and the three-phase/two-phase transformation section 106 in the motor control section 41 (see FIG. 3), the control internal value creating section 43 has a speed command creating section inverse model 111, a torque command creating section inverse model 112, a current command creating section inverse model 113, a voltage command creating section inverse model 114, a three-phase/two-phase transformation section 115, and a three-phase/two-phase transformation section 116.

In FIG. 4, the command from the upper-level controller to the motor control section 41 is the position command θ*. However, the command may be the torque command Trq* or the speed command ω*. When the command from the upper-level controller is the torque command Trq*, the speed command ω*, and the position command θ*, the block diagram of the control internal value creating section 43 becomes a block diagram on the right side of a boundary line C in FIG. 4, a block diagram on the right side of a boundary line D, and a block diagram on the right side of a boundary line E, respectively.

By the configuration illustrated in FIG. 4, the control internal value creating section 43 calculates the d-axis current feedback value Id and the q-axis current feedback value Iq, the d-axis voltage command Vd* and the q-axis voltage command Vq*, the d-axis current command Id* and the q-axis current command Iq*, the torque command Trq*, the speed command ω*, and the position command θ* on the basis of any one or a plurality of the motor three-phase voltage feedback values Vu, Vv, and Vw, the motor three-phase current feedback values Iu, Iv, and Iw, the speed feedback value ωm, and the position feedback value θm, which are the time-series data acquired by the current sensor, the voltage sensor, and the position sensor independently installed on the input part or the output part of the motor 13 separately from ones for the motor control section 41.

In the present embodiment, θ*, θm, ω*, ωm, Trq*, Id*, Iq*, Id, Iq, Vd*, Vq*, Vu*, Vv*, Vw*, Vu, Vv, Vw, Iu, Iv, and Iw, which are state variables of the motor control section 41, the difference between the command value and the actual measurement value, and output values of a proportion section, an integration section, and a derivation section that configure a control section are the internal values of the motor control. That is, any one or a plurality of these motor control internal values in the motor control section 41 are created by the control internal value creating section 43.

In the present embodiment, state variables that are created and used in the process of processing by the motor control section 41 and are not output from the motor control section 41 (for example, Id*, Iq*, Id, Iq, Vd*, Vq*) in the state variables of the motor control section 41 can also be created by the control internal value creating section 43 illustrated in FIG. 4. This allows the present embodiment to be applied to estimation of various states of a wide variety of injection molding machines 1.

Figure 5:
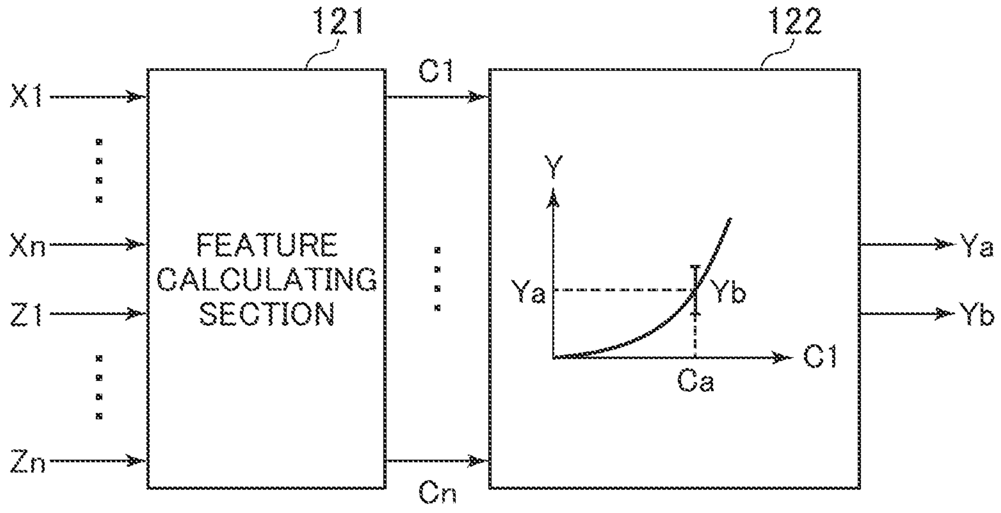
FIG. 5 is a schematic diagram illustrating the functional configuration of a feature calculating section and a computing section according to the present embodiment.

FIG. 5 is a block diagram schematically illustrating the functional configuration of the state calculating section 44.

As described above, the state calculating section 44 (see FIG. 2) calculates the state amount indicating the state of the injection molding machine 1, that is, the state of the equipment itself and the state (quality and so forth) of a manufactured object manufactured by the equipment, on the basis of at least one internal value of the motor control created by the control internal value creating section 43. The state calculating section 44 may calculate the state amount on the basis of data (temperature of the equipment and so forth) acquired by the external data acquiring section 47 (see FIG. 2) in addition to the internal value of the motor control. Thus, in FIG. 5, FIG. 6A, and FIG. 6B, the motor control internal values (X1 to Xn) and the data (Z1 to Zn) acquired by the external data acquiring section 47 are input to the state calculating section 44.

X1 to Xn in FIG. 5 indicate the internal values of the motor control, and Z1 to Zn indicate information acquired by the external data acquiring section 47. At least one internal value of the motor control is input to the state calculating section 44. Furthermore, the presence or absence of input of the information acquired by the external data acquiring section 47 to the state calculating section 44 and the number of inputs are optional.

The kind and quantity of the internal values of the motor control and the information acquired by the external data acquiring section 47 input to the state calculating section 44 are set according to the configuration (for example, statistical model to be described later) of the state calculating section 44.

In FIG. 5, the same "n" is used as suffixes of Xn, Zn, and Cn (to be described later) for convenience. However, this "n" indicates that the quantity of each of Xn, Zn, and Cn is optional and does not mean that the quantities of Xn, Zn, and Cn are the same.

In the configuration example of FIG. 5, the state calculating section 44 has a regression expression as a statistical model used for state amount calculation. In the present configuration example, the state calculating section 44 includes feature calculating section 121 that sets features to become explanatory variables of the regression expression and a computing section 122 that calculates the state amount (objective variables) by the regression expression on the basis of the features set by the feature calculating section 121. The computing section 122 is the diagnosis section.

The internal value Xn and the information Zn are input to the feature calculating section 121 and the feature calculating section 121 calculates a feature (explanatory variable) Cn to be used as an input to the computing section 122 on the basis of the input Xn and Zn. The feature calculating section 121 outputs instantaneous data of Xn and Zn directly as the feature Cn without processing the data or outputs a result (amplitude, phase, and so forth) of frequency analysis of the instantaneous data of Xn and Zn in a predetermined time zone, the effective value, average value (current average value or the like), standard deviation, maximum value, or minimum value in a predetermined time zone, or the overshoot amount or the peak value in a predetermined time zone. The number of features Cn may be either single or multiple depending on the regression expression.

Moreover, the feature calculating section 121 may output a predetermined quantity computed from the internal value of the motor control, for example, active power, reactive power, or the like, as the feature. Furthermore, disturbance torque or the like estimated by a commonly called observer may be employed as the feature. These features may be output after frequency analysis, statistical calculation (average), or the like is further executed for them.

The features C1 to Cn output from the feature calculating section 121 are input to the computing section 122, and the computing section 122 calculates state amount estimation values (Ya, Yb) on the basis of the features C1 to Cn.

Here, description will be made about calculation of the feature relating to the power transmission mechanism (in particular, screw shaft 17 of the ball screw mechanism 20) by the injection molding machine 1 and an abnormality determination method of the equipment, which are one of characteristics of the present embodiment.

Figure 6A:
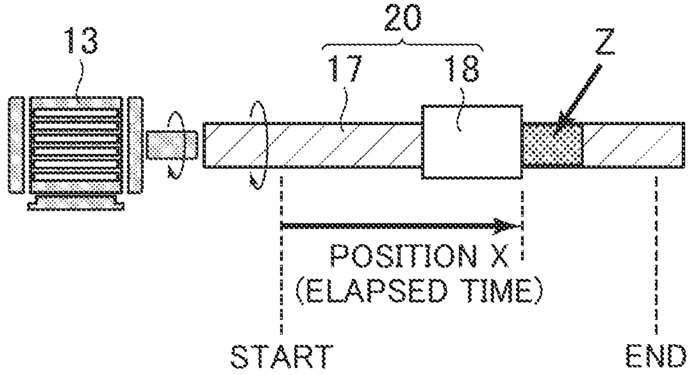
FIG. 6A is a schematic diagram illustrating the state of operation and a deterioration place of a ball screw mechanism according to the present embodiment.

FIG. 6A schematically illustrates the state of operation and a deterioration place of the ball screw mechanism 20 of the injection molding machine 1. Due to use of the ball screw mechanism 20 over a long term, grooves of the screw shaft 17 deteriorate. At this time, although the grooves of the screw shaft 17 uniformly deteriorate in some cases, it is more often that deterioration sequentially occurs from a specific place due to a bias of the frequency of use. For example, in the case of FIG. 6A, the state in which a deterioration place Z is caused at a part at which the nut part 18 positioned on the screw shaft 17 is closer to the latter half from the middle point of the screw shaft 17 is illustrated. Such deterioration causes instability of mold opening-closing operation and therefore it is desirable to sense the deterioration early with high precision.

Figure 6B:
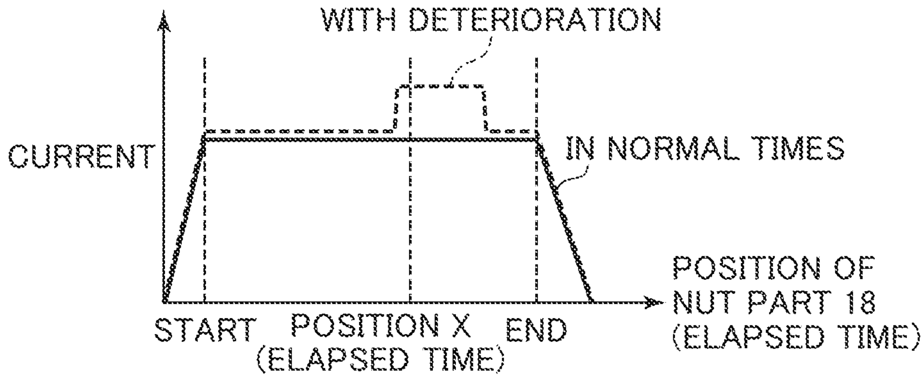
FIG. 6B is a schematic diagram illustrating the state of a normal value and an abnormal value of a current value when deterioration determination processing according to the present embodiment is not executed.

FIG. 6B schematically illustrates the state of change in a current until the ball screw mechanism 20 and so forth reach an end position (end time) from a start position (start time). First, when the nut part 18 moves in the injection direction from the start position (start time) due to rotation of the screw shaft 17, the current rises in association with the stress of the injection. Then, at the stage when the nut part 18 has reached a position (elapsed time) X subsequently, the current rises in a protruding manner (dotted line). This is because more friction than in normal times is caused due to the deterioration place Z of the screw shaft 17, and the motor torque for driving the ball screw mechanism 20 increases correspondingly.

As above, the feature calculating section 121 can sense the deterioration of the screw shaft 17 by monitoring the change in the current value from the start position (start time) to the end position (end time).

However, there is a problem that generally it is remarkably difficult to determine change in the current, for example, in the case in which deterioration is at the initial stage or in the case of a swing of noise or the like in the current value. That is, this is because the difference from the normal current value becomes slight in these cases.

Thus, in the present embodiment, the process in which the ball screw mechanism 20 reaches the end point from the start point is divided into a predetermined plurality of regions and the average value of the current value in each region is calculated. The difference value between the average value of the current when the state of the ball screw mechanism 20 has been defined as the normal state in advance and the average value of the current at the time of diagnosis is calculated regarding each region. Thereafter, the maximum value of the calculated difference value of each region is extracted as the feature. By comparing this feature and the threshold defined in advance, whether or not deterioration of the screw shaft 17 exists and the degree of deterioration are determined.

Figure 7A:
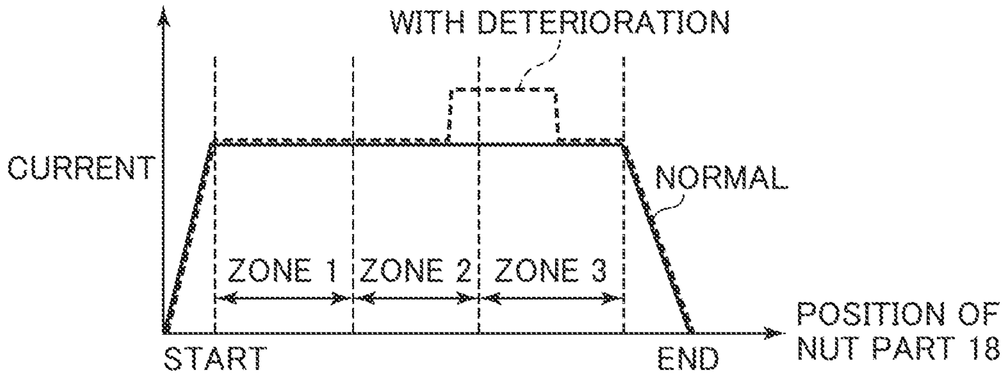
FIG. 7A is a schematic diagram illustrating the state of the normal value and the abnormal value of the current value when the deterioration determination processing according to the present embodiment is executed.
Figure 7B:
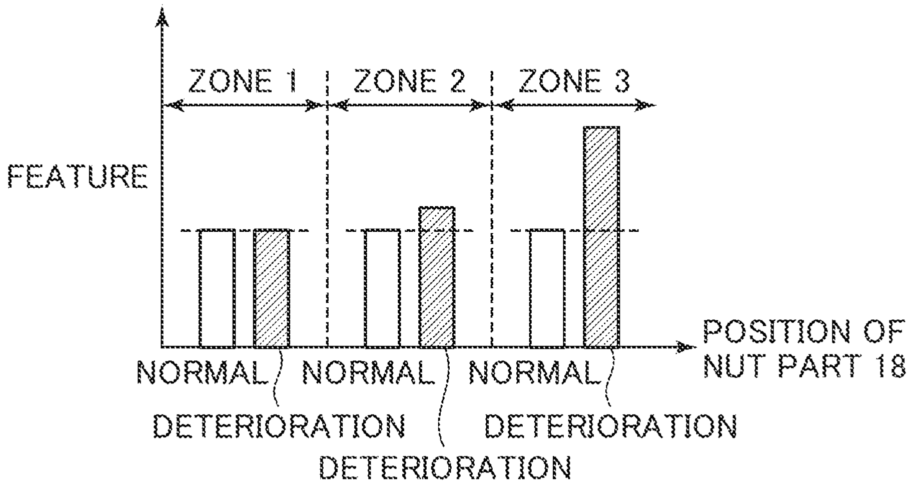
FIG. 7B is a schematic diagram illustrating a computation result of the average value of the normal value and the abnormal value of each divided section when the deterioration determination processing according to the present embodiment is executed.

In FIG. 7A and FIG. 7B, the state of region division and the state of deterioration determination based on the feature in the present embodiment is schematically illustrated. In FIG. 7A, the zone of one process (unit process) relating to injection from the start point to the end point is divided into an optional plurality of regions. For example, in the case of the injection molding machine 1 as in the present embodiment, the place at which the nut part 18 is located on the screw shaft 17 can be sensed based on the number of rotations of the motor 13. For example, supposing that the number of rotations of the motor 13 in one process is 30 rotations, the zone of one process is divided into three zones 1 to 3 of every 10 rotations. The dividing method is not limited to even dividing and may be uneven dividing. For example, when a deterioration part is predicted to some extent from an empirical rule, experiment, or the like in advance, the zone of one process may be divided in such a manner that the zone in which the relevant deterioration is anticipated is set larger (or smaller) than the other zones.

The feature calculating section 121 and the computing section 122 measure current values equal to or smaller than a threshold (normal values) in current values sensed at predetermined time intervals in each zone and the number of current values equal to or smaller than the threshold, and calculate the average thereof. Similarly, the feature calculating section 121 and the computing section 122 measure current values larger than the threshold (abnormal values) in the current values sensed at the predetermined time intervals in each zone and the number of current values larger than the threshold, and calculates the average thereof. Thereafter, the feature calculating section 121 and the computing section 122 output these results to the state estimating section 42.

In FIG. 7B, the feature (average value) of the current of each zone is schematically illustrated. In this diagram, it turns out that, in zone 3, the average value of the abnormal value is larger than the average value of the normal value and is the largest in comparison with the other zones. The state estimating section 42 determines that the screw shaft 17 has deteriorated, and outputs the deterioration and the deterioration position to the motor control updating section 46 and the information transmitting section 45.

Figure 8A:
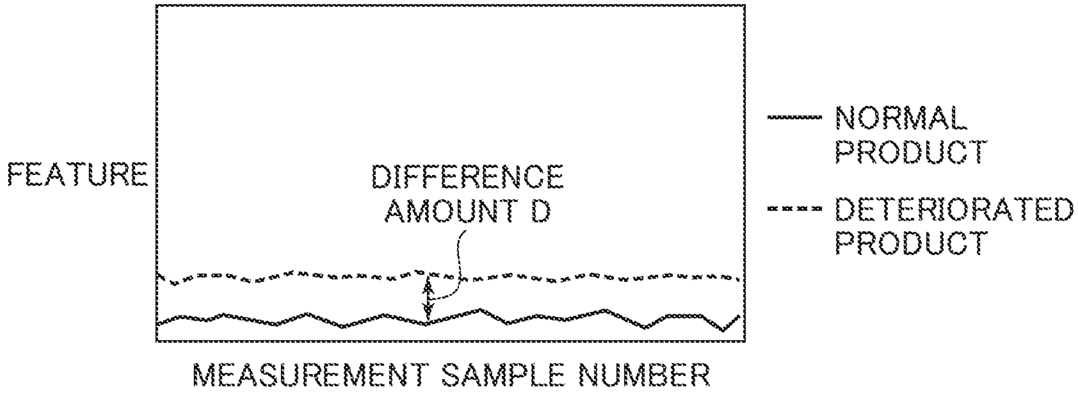
FIG. 8A is a diagram illustrating the distribution of the average value of the normal value and the abnormal value of each cycle based on the case in which the deterioration determination processing according to the present embodiment is not executed.
Figure 8B:
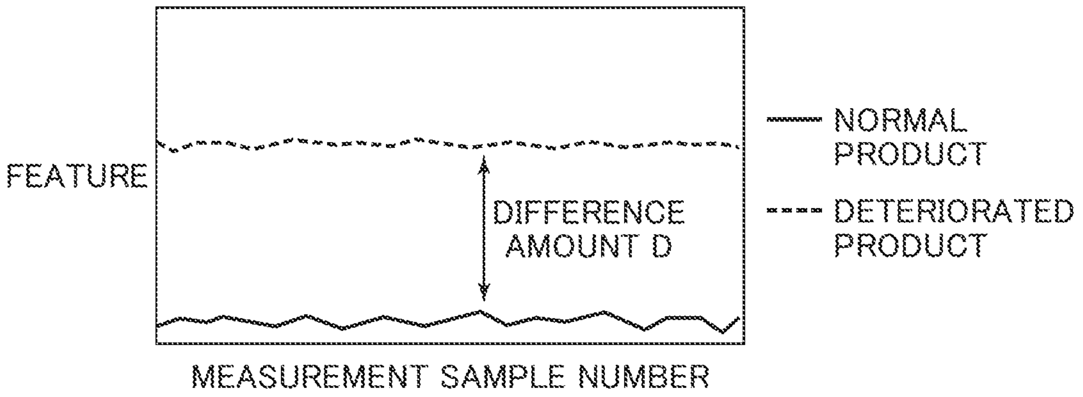
FIG. 8B is a diagram illustrating the distribution of the average value of the normal value and the abnormal value of each cycle based on the case in which the deterioration determination processing according to the present embodiment is executed.

In FIGS. 8A and 8B, one example of comparison of results between the case in which the deterioration determination based on such a feature is executed and the case in which the deterioration determination is not executed is schematically illustrated. In FIG. 8A and FIG. 8B, the abscissa axis indicates the number of samples(=data of 50 processes is used for each of normal products and deteriorated products) and the ordinate axis indicates the feature (difference value of the average value of the current) in each sample.

FIG. 8A is an example of the case in which merely comparison of the current value is executed without executing the above-described deterioration determination processing. That is, FIG. 8A is obtained by calculating, as the feature, the difference value between the average value of the current in normal times (in the present verification, the average value of the current of 50 processes of normal data) and the average value of the current of each sample, and indicating the calculation result regarding each cycle. As illustrated in this diagram, there is the case in which a difference value (difference amount) D of the average value between the normal value and the abnormal value is slight.

In contrast, it turns out that, in the case of executing the above-described deterioration determination processing illustrated in FIG. 8B, the difference value (difference amount) D between a normal current value group and an abnormal current value group increases compared with the case illustrated in FIG. 8A, and the difference between the normal products and the deteriorated products enlarges (that is, the sensitivity of sensing of deterioration increases). That is, in the above-described deterioration determination, one process is first divided into a plurality of regions and the average between the normal value and the abnormal value in each of these divided sections is calculated. Thus, the number of samples in the calculation of the average value is small, and the degree at which a prominently large value affects the average value becomes higher than that in the case of calculating the average value without executing the deterioration determination processing (system of FIG. 8A). Furthermore, the abnormal average value of the zone in which the average value of the abnormal value is higher among the respective divided regions susceptible to the influence of the prominently large value as above is treated as the abnormal value in the relevant one cycle (process). Therefore, the difference between the most abnormal average value of the current value and the normal average value appears as a relatively large current value difference. That is, it is possible to obtain a remarkable effect that determination of normality and abnormality can be clearly executed even when the swing amplitude of the current value is slight, and the precision of deterioration sensing improves and sensing at an early stage of deterioration is also enabled.

As above, according to the present embodiment, one process is divided into a plurality of zones, the average values of the normal value and the abnormal value of each zone are calculated, and the value of the highest abnormal value average among them is deemed as the target of deterioration determination. Thus, deterioration detection on the power transmission mechanism can be sensed with higher precision and probability. In particular, according to the present invention, an effect of improvement in the precision and the probability with which sensing as an abnormality is allowed even when deterioration of the power transmission mechanism is small or even when deterioration is at the initial stage can be expected.

Here, the abnormal value often varies compared with the normal value depending on deterioration of the power transmission mechanism, and it is thought that it is also possible to execute deterioration determination by determining also this variation.

By determining the above-described variation, abnormality detection on the power transmission mechanism can be sensed with higher precision and probability.

Figure 9:
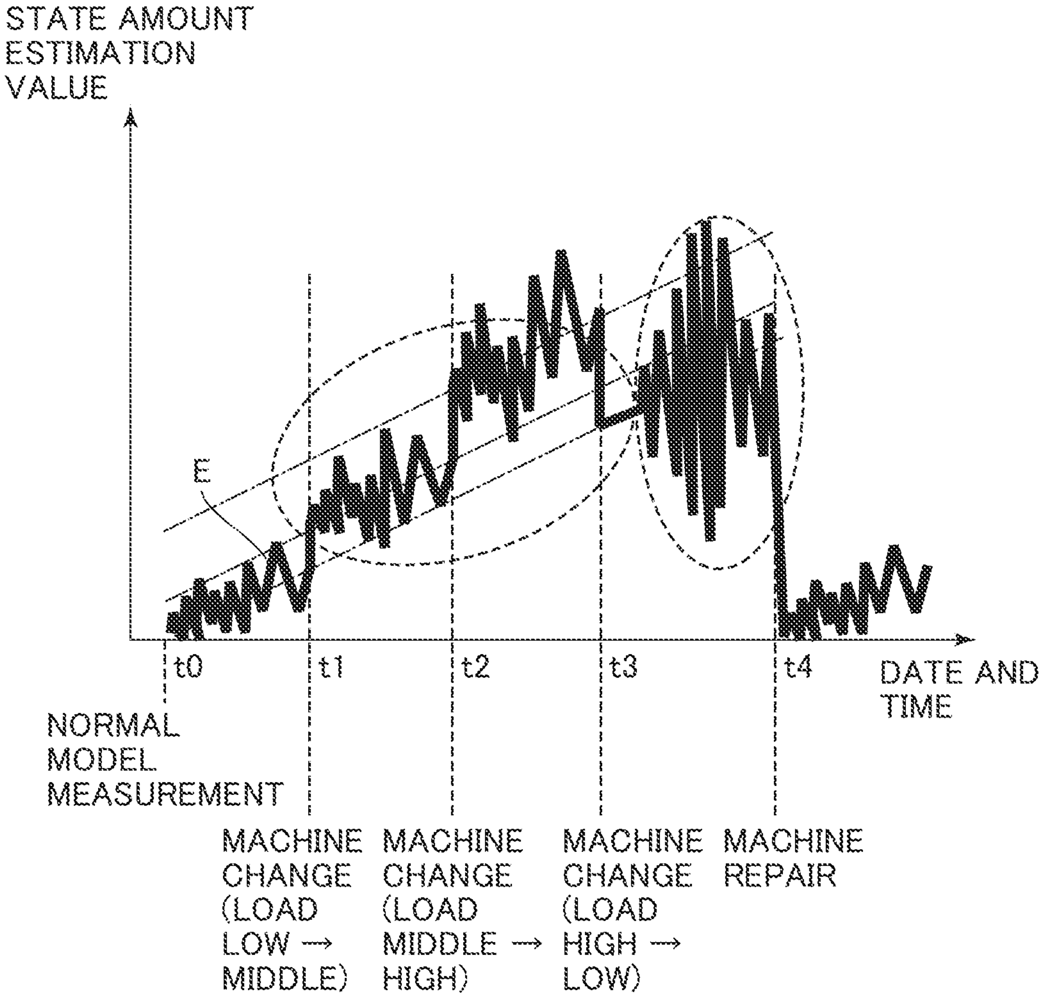
FIG. 9 is a diagram that explains state amount fluctuation of a power transmission mechanism.

FIG. 9 is a diagram that explains state amount fluctuation of the power transmission mechanism, that is, variation in the abnormal value. In FIG. 9, the ordinate axis indicates the state amount estimation value and the abscissa axis indicates the elapsed date and time. In FIG. 9, at date and time to, a normal model is measured, and the state amount of the power transmission mechanism in the normal state is set. The load is changed from a low load to a middle load at date and time t1, and the load is changed from the middle load to a high load at date and time t2. Then, the load is changed from the high load to the low load at date and time t3, and the machine is repaired at date and time t4.

In this case, a state amount E increases while fluctuating from the date and time to toward the date and time t3. However, the state amount E makes the transition with normal fluctuation width (variation). Regarding the period from the date and time t3 to t4, the fluctuation width (variation) of the state amount E is larger than the fluctuation width (variation) of the period from the date and time t0 to t3 and it can be determined that an abnormality has occurred.

Figure 10:
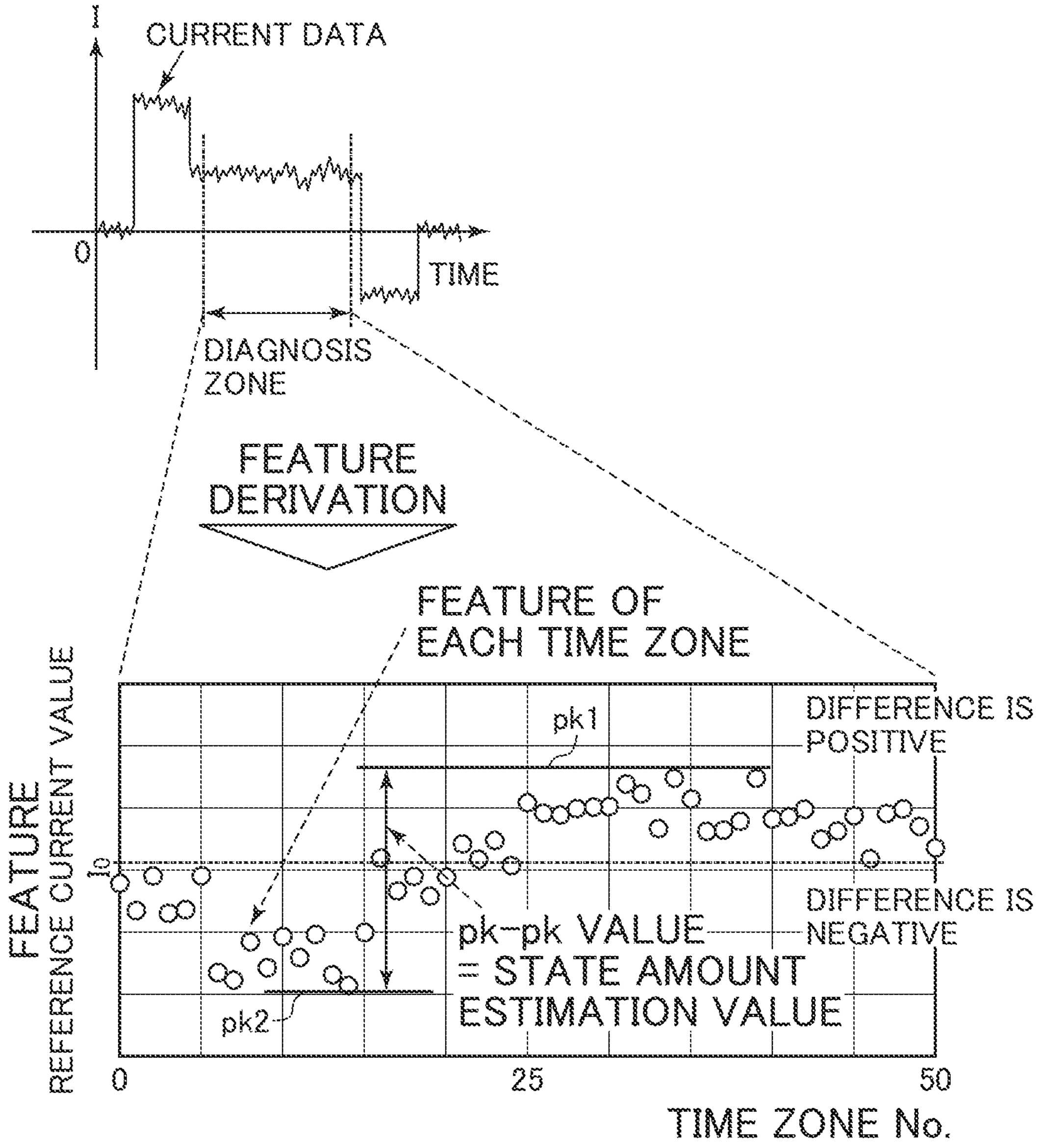
FIG. 10 is a diagram that explains sensing of a peak value and a peak value of features according to the present embodiment.

FIG. 10 is a diagram that explains sensing of a peak value and a peak value of features. In FIG. 10, regarding time change of current data, the features are derived in a diagnosis zone, the peak value (positive side) and the peak value (negative side) of the features are sensed, and the state amount estimation value (pk-pk value) is calculated. The ordinate axis of a graph of FIG. 10 indicates the feature and the abscissa axis indicates the time zone number. A plurality of circle marks in the graph indicate the features of the respective time zones. The features larger than the feature of a normal model are indicated in the region in which the difference is positive in the upper half of the graph, and the features smaller than the feature of the normal model are indicated in the region in which the difference is negative in the lower half of the graph.

The difference (absolute value) between pk1 (maximum average current value) that is the feature of the maximum value in the region in which the difference is positive and pk2 (minimum average current value) that is the feature of the minimum value in the region in which the difference is negative is deemed as the state amount estimation value, and whether or not an abnormality has occurred can be determined from this state amount estimation value.

The "reference current value serving as the basis" used for the feature calculation may be generated by the state estimating section 42 or may be prepared as a profile by the user in advance. Furthermore, it is also possible that the user obtains an average current value and sets it as the reference value in advance.

Figure 11:
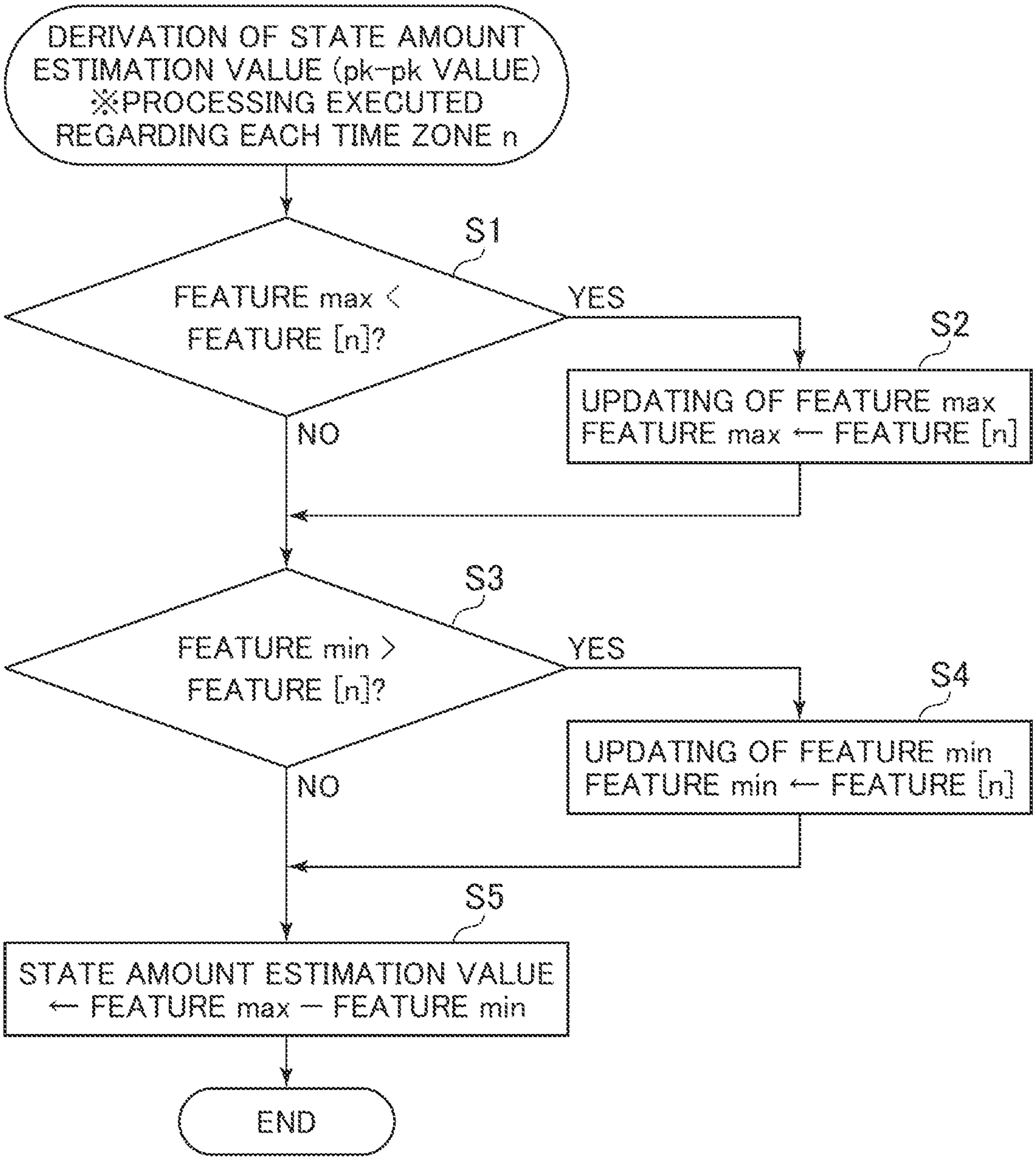
FIG. 11 is a flowchart of computation of the peak value, the peak value, and difference of the features according to the present embodiment.

FIG. 11 is a flowchart of computation of the difference between the peak value (positive side) and the peak value (negative side) of the features executed in the computing section 122. In FIG. 11, the initial value is a value when n=0, and the values of feature max and feature min are 0.

In a step S1 in FIG. 11, whether or not a calculated feature is larger than the maximum feature is determined. When the calculated feature is larger than the maximum feature, the processing proceeds to a step S2 and the calculated feature is defined as the maximum feature, and the processing proceeds to a step S3. When the calculated feature is equal to or smaller than the maximum feature in the step S1, the processing proceeds to the step S3.

In the step S3, whether or not the calculated feature is smaller than the minimum feature is determined. When the calculated feature is smaller than the minimum feature, the processing proceeds to a step S4 and the calculated feature is defined as the minimum feature, and the processing proceeds to a step S5. When the calculated feature is larger than the minimum feature in the step S3, the processing proceeds to the step S5.

In the step S5, the minimum feature is subtracted from the maximum feature to make the state amount estimation value.

Determination of abnormality occurrence can be executed through comparing the obtained state amount estimation value with a normal state amount estimation value defined in advance. The determination of abnormality occurrence is executed in the computing section 122 and the result thereof can be displayed on the information transmitting section 45. Furthermore, it is also possible to display, on the information transmitting section 45, the graph illustrated in FIG. 9 and the graph that is illustrated in FIG. 10 and indicates the relationship between the state amount estimation value and the date and time. Moreover, it is also possible to display the average current value and the feature on the information transmitting section 45. In this case, measured data may be all displayed, or it is also possible to display data at an interval of a specified number of days instead of displaying all of the data. For example, even when data is measured every day, regarding display, data of every one week is displayed. Furthermore, it is also possible to average the state amount estimation values measured multiple times in one day and display the average as the state amount estimation value of the day.

The management method of the present invention is a management method for a power transmission mechanism that transmits a driving force from an electric motor to a load-side device, and includes a current acquisition step of acquiring the current value per unit process in which the power transmission mechanism is driven, an average current value calculation step of dividing the unit process into multiple zones and calculating the average current value obtained by averaging the current value of each zone, and an abnormality detection step of executing abnormality detection. The abnormality detection step calculates the state amount estimation value on the basis of the average current value of the multiple zones and executes abnormality sensing in the unit process on the basis of the state amount estimation value.

According to embodiment example 1 of the present invention, one process (time zone) is divided into multiple zones, the difference between the average value of the current value of each zone and the normal value is calculated, and the maximum value among them is defined as the feature. Furthermore, the variation (pk-pk value) in the feature in multiple processes (multiple time zones) is calculated as the state amount estimation value, and an abnormality of the power transmission mechanism is determined based on the calculated state amount estimation value.

Thus, it is possible to implement a management device and a management method that can sense abnormality (deterioration) detection on the power transmission mechanism with higher precision and probability. In particular, according to the present invention, there is an effect of improvement in the precision and the probability with which sensing as an abnormality is allowed even when an abnormality (deterioration) of the power transmission mechanism is small or even when an abnormality (deterioration) is at the initial stage.

Embodiment Example 2

Next, embodiment example 2 of the present invention will be described.

The overall configuration of embodiment example 2 of the present invention is similar to that of embodiment example 1, and therefore illustration and detailed description are omitted.

In the above-described embodiment example 1, the configuration in which the peak value and the peak value of the features are sensed and the state amount estimation value (pk-pk value) is calculated as illustrated in FIG. 10 is used.

In contrast, in embodiment example 2, the average value of the features in the region in which the current value difference from a reference current value Io indicated at the center of the ordinate axis of the graph of FIG. 10 is positive is defined as a first current value group average value (FVave1), and the average value of the features in the region in which the current value difference from the reference current value Io is negative is defined as a second current value group average value (FVave2). Moreover, the absolute value of the difference between the first current value group average value and the second current value group average value is calculated as the state amount estimation value (abs(FVave1−FVave2)).

Then, determination of an abnormality is executed by using the state amount estimation value (abs(FVave1−FVave2)).

Figure 12:
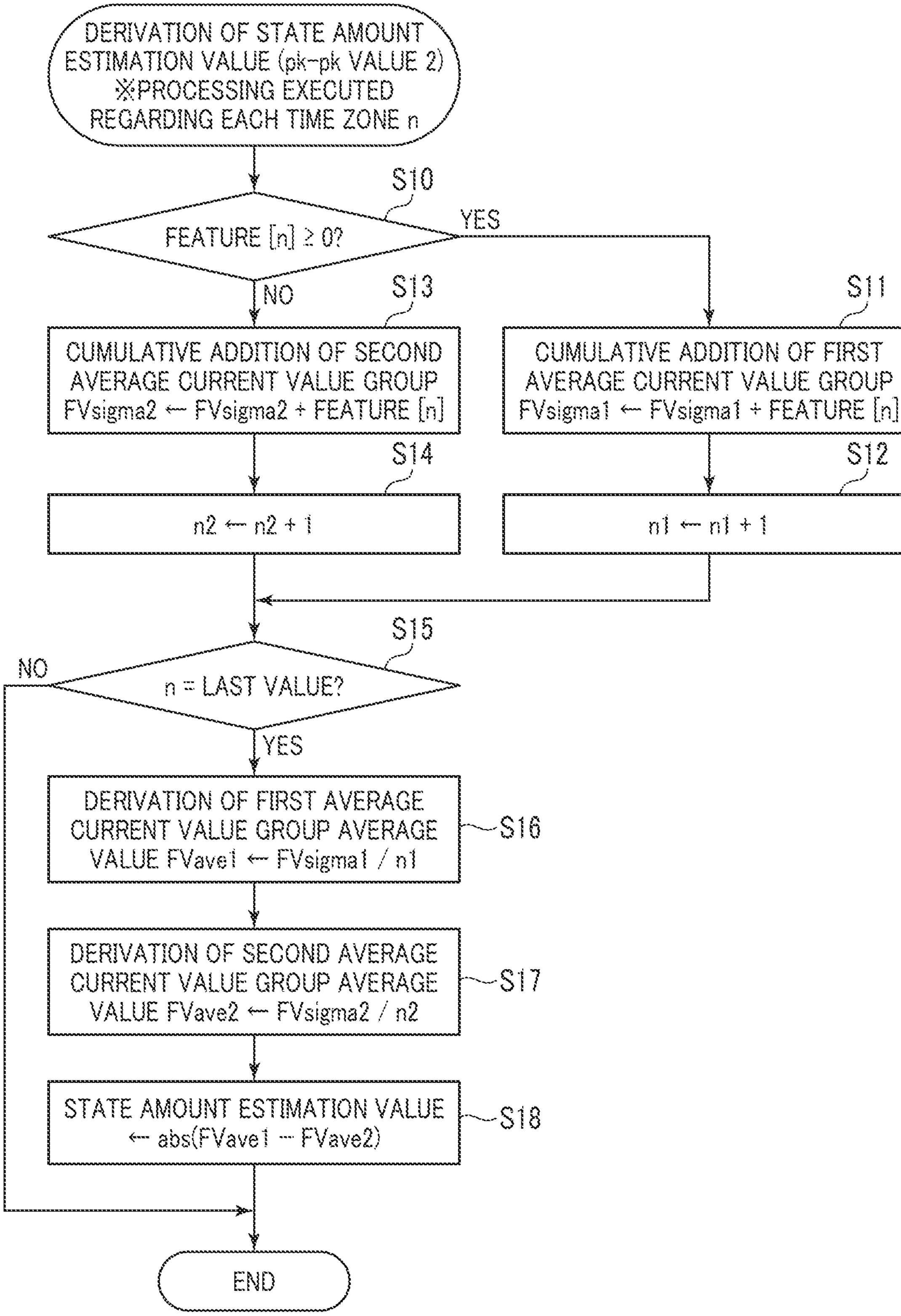
FIG. 12 is a flowchart of another computation method for computing a peak value, a peak value, and difference of the features according to the present embodiment.

FIG. 12 is a flowchart of computation of the state amount estimation value executed in the computing section 122. In FIG. 12, the initial value is a value when n=0, and n1=n2=0, FVsigma1=0, and FVsigma2=0 are set.

In a step S10 in FIG. 12, whether or not the feature is equal to or larger than 0 is determined. When the feature is equal to or larger than 0, the processing proceeds to a step S11. In the step S11, cumulative addition of the first average current value group is executed (FVsigma1←FVsigma1+feature). Then, the processing proceeds to a step S12, n1+1 is employed as n1, and the processing proceeds to a step S15.

When the feature is smaller than 0 in the step S10, the processing proceeds to a step S13. In the step S13, cumulative addition of the second average current value group is executed (FVsigma2←FVsigma2+feature). Then, the processing proceeds to a step S14, n2+1 is employed as n2, and the processing proceeds to the step S15.

In the step S15, whether or not n is the last value is determined. When n is not the last value, the processing ends.

When n is the last value in the step S15, the processing proceeds to a step S16 and derivation (calculation) of the first average current value group average value is executed (FVave1←FVsigma1/n1). Then, the processing proceeds to a step S17 and derivation (calculation) of the second average current value group average value is executed (FVave2←FVsigma2/n2). Then, the processing proceeds to a step S18, the state amount estimation value is set to abs(FVave1−FVave2), and the processing is ended.

Also in embodiment example 2 of the present invention, effects similar to those of embodiment example 1 can be obtained.

Embodiment Example 3

Next, embodiment example 3 of the present invention will be described.

The overall configuration of embodiment example 3 of the present invention is similar to that of embodiment example 1, and therefore illustration and detailed description are omitted.

In embodiment example 1, the configuration in which the peak value (positive side) and the peak value (negative side) of the features are sensed and the state amount estimation value (pk-pk value) is calculated as illustrated in FIG. 10 is used.

Figure 13A:
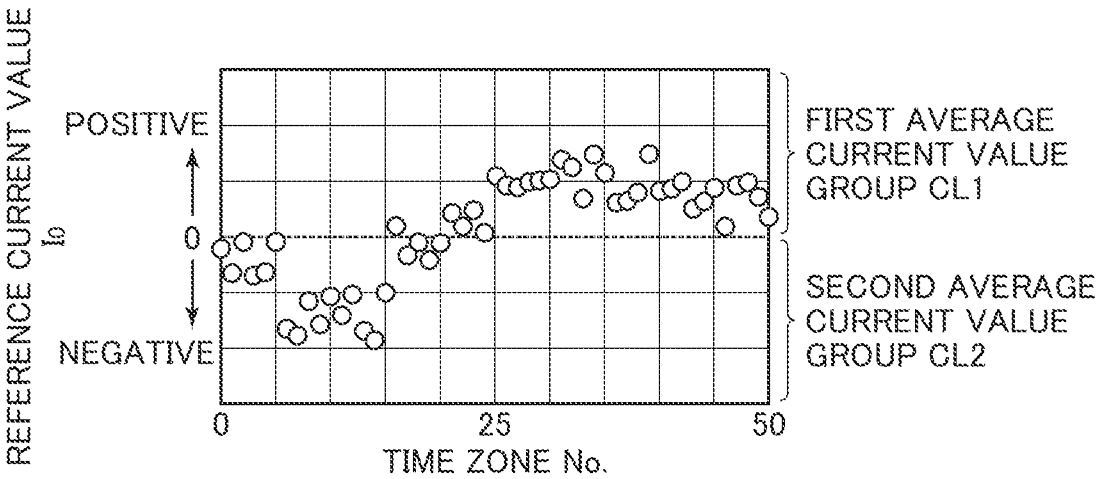
FIG. 13A is an explanatory diagram of a method in which the rule of majority is employed in computation of a peak value, a peak value, and difference of the features according to the present embodiment.
Figure 13B:
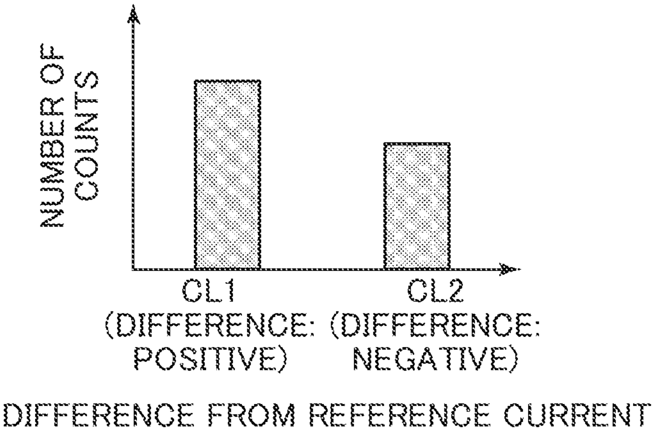
FIG. 13B is an explanatory diagram of the method in which the rule of majority is employed in the computation of the peak value, the peak value, and the difference of the features according to the present embodiment.
Figure 13C:
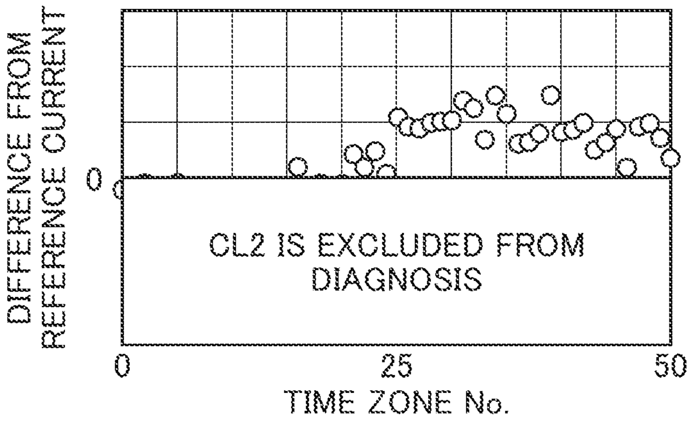
FIG. 13C is an explanatory diagram of the method in which the rule of majority is employed in the computation of the peak value, the peak value, and the difference of the features according to the present embodiment.

In contrast, in embodiment example 3, as illustrated in FIG. 13A, a first average current group CL1 of the features average value of the region in which the difference from the reference current value Io is positive is acquired and the average value of the features in the region in which the difference from the reference current value Io is negative is defined as a second average current value group CL2. Moreover, the number of features of the first average current value group CL1 and the number of features of the second average current value group CL2 are compared with each other (illustrated in FIG. 13B). In the example illustrated in FIG. 13B, the number of features of the first average current value group CL1 is larger than the number of features of the second average current value group CL2. In this case, as illustrated in FIG. 13C, the features of the second average current value group CL2 are excluded from the diagnosis of an abnormality, and the diagnosis of an abnormality is executed by using the features of the first average current value group CL1. That is, it is an example in which, based on the rule of majority, the diagnosis of an abnormality is executed by using the data of the region with a larger number of pieces of data. This example can be applied to abnormality diagnosis of the power transmission mechanism in which load fluctuation is frequently large or the power transmission mechanism in a transient state.

Figure 14:
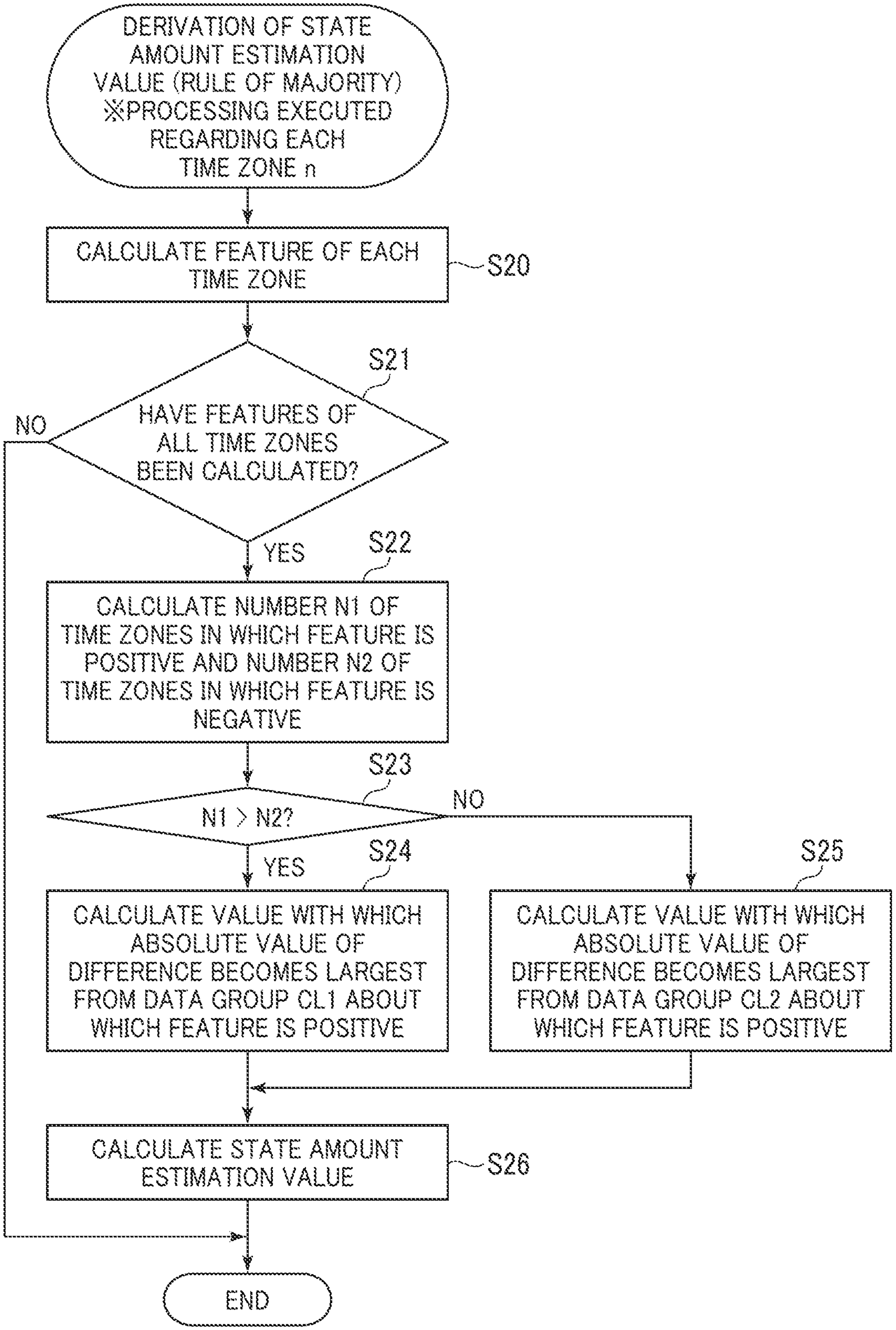
FIG. 14 is a flowchart that explains a method in which rule-of-majority processing is executed in order to compute the peak value, the peak value, and the difference of the features according to the present embodiment.

FIG. 14 is a flowchart of computation of the state amount estimation value executed in the computing section 122. In FIG. 14, the feature of each time zone is calculated in a step S20 and the processing proceeds to a step S21. In the step S21, whether or not the features of all time zones have been calculated is determined. The processing ends when the features have not been calculated, and the processing proceeds to a step S22 when the features have been calculated.

In the step S22, the number N1 of features in the time zones in which the feature is positive and the number N2 of features in the time zones in which the feature is negative are calculated. Then, in a step S23, whether or not the number N1 is larger than the number N2 is determined. When the number N1 is larger than the number N2, the processing proceeds to a step S24, the value with which the absolute value of the difference becomes the maximum is calculated from the data group CL1 about which the feature is positive, and the processing proceeds to a step S26.

When the number N1 is not larger than the number N2 in the step S23, the processing proceeds to a step S25, the value with which the absolute value of the difference becomes the maximum is calculated from the data group CL2 about which the feature is negative, and the processing proceeds to the step S26.

In the step S26, the state amount estimation value is calculated, and the processing is ended.

Also in embodiment example 3 of the present invention, effects similar to those of embodiment example 1 can be obtained. In addition, there is an effect of improvement in the precision and the probability with which sensing as an abnormality is allowed in abnormality diagnosis (abnormality sensing) of the power transmission mechanism in which load fluctuation is frequently large or the power transmission mechanism in a transient state.

Embodiment Example 4

Next, embodiment example 4 of the present invention will be described.

The overall configuration of embodiment example 4 of the present invention is similar to that of embodiment example 1, and therefore illustration and detailed description are omitted.

Figure 15:
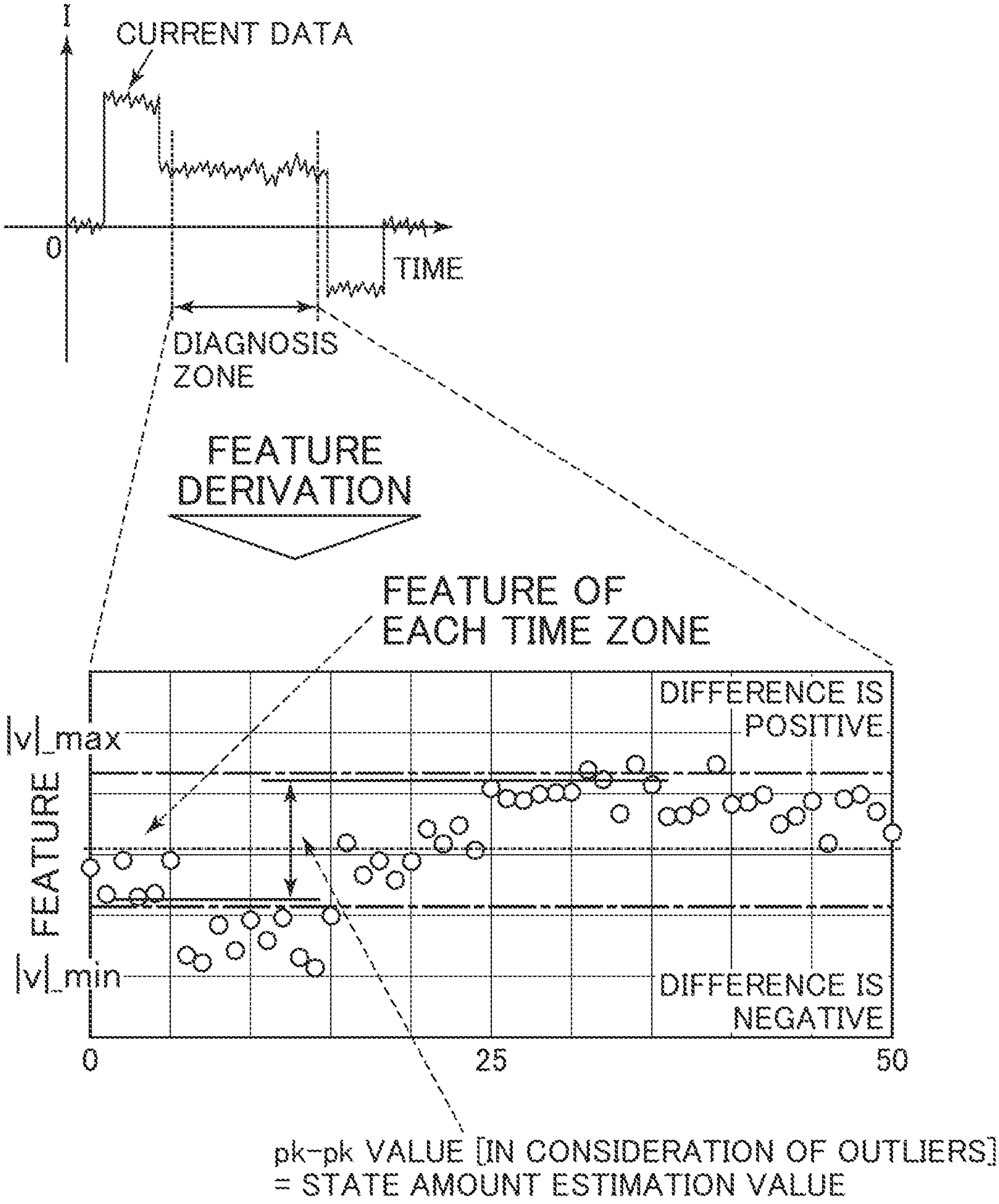
FIG. 15 is an explanatory diagram of considering outliers in sensing of a peak value and a peak value of the features according to the present embodiment.

In embodiment example 4, as illustrated in FIG. 15, the features that exceed a positive threshold (vmax) in the region in which the difference is positive and the features smaller than a negative threshold (vmin) in the region in which the difference is negative are excluded as outliers, and the state amount estimation value is calculated by using the features that are equal to or smaller than the positive threshold and equal to or larger than the negative threshold. As an abnormality sensing method using the state amount estimation value, a method similar to that of embodiment example 1, embodiment example 2, or embodiment example 3 can be used.

Figure 16:
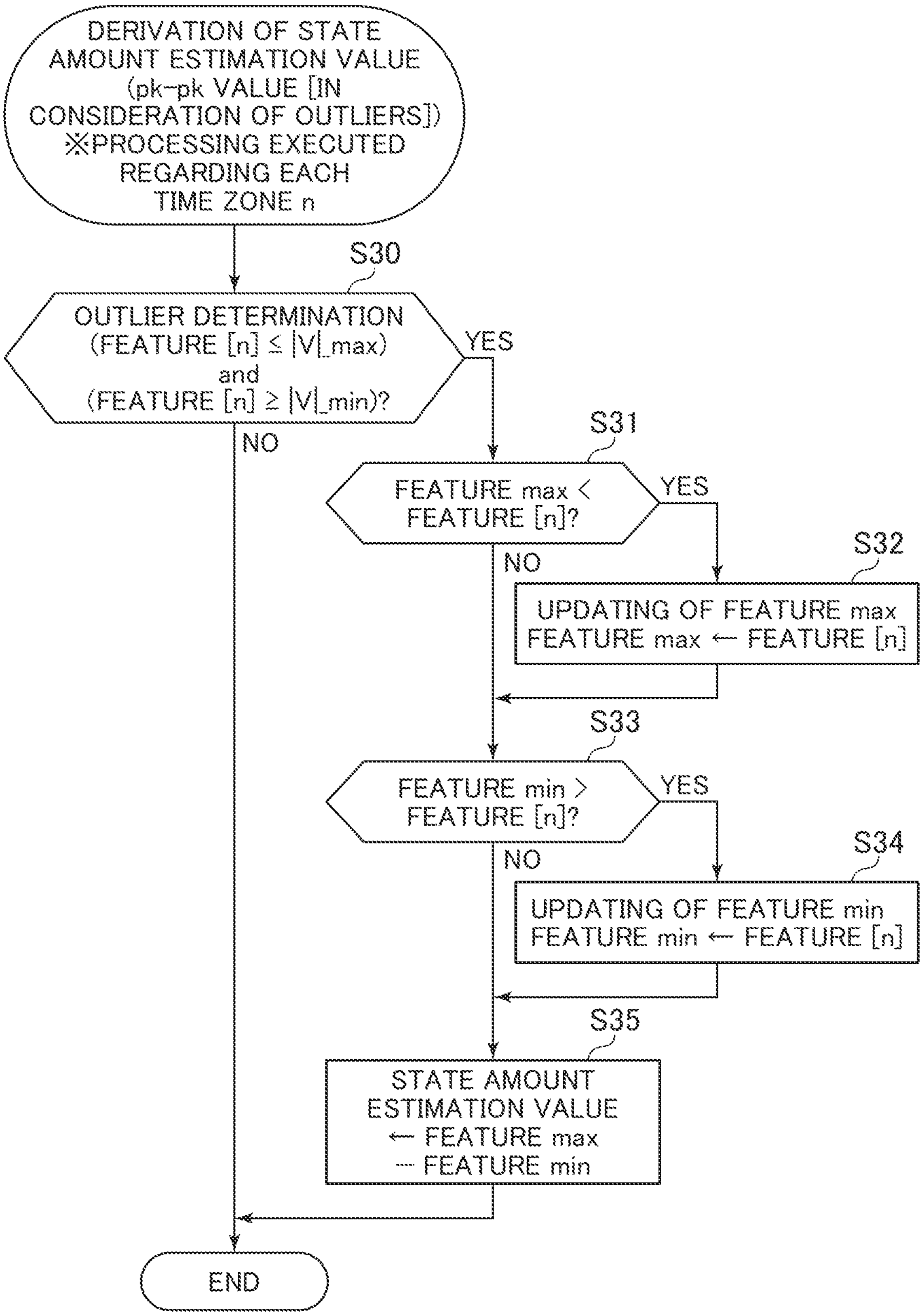
FIG. 16 is a flowchart that explains a method in which outlier processing is executed in order to compute the peak value, the peak value, and difference of the features according to the present embodiment.

FIG. 16 is a flowchart of computation of the state amount estimation value through exclusion of features as outliers, executed in the computing section 122. In FIG. 16, the initial value is a value when n=0, and the values of feature max and feature min are 0.

In a step S30 in FIG. 16, it is determined whether or not a calculated feature is equal to or smaller than the positive threshold (vmax) and equal to or larger than the negative threshold (vmin). When the calculated feature is equal to or smaller than the positive threshold (vmax) and equal to or larger than the negative threshold (vmin), the processing proceeds to a step S31. The processing ends when the calculated feature is not equal to or smaller than the positive threshold (vmax) or equal to or larger than the negative threshold (vmin) in the step S30.

In the step S31, whether or not the calculated feature is larger than feature max is determined. When the calculated feature is larger than feature max, the processing proceeds to a step S32, the calculated feature is defined as the maximum feature (feature max), and the processing proceeds to a step S33. When the calculated feature is equal to or smaller than feature max in the step S31, the processing proceeds to the step S33.

In the step S33, whether or not the calculated feature is smaller than feature min is determined. When the calculated feature is smaller than feature min, the processing proceeds to a step S34, the calculated feature is defined as the minimum feature (feature min), and the processing proceeds to a step S35. When the calculated feature is equal to or larger than feature min in the step S33, the processing proceeds to the step S35.

In the step S35, feature min is subtracted from feature max to make the state amount estimation value.

Also in embodiment example 4 of the present invention, effects similar to those of embodiment example 1 can be obtained. In addition, there is an effect of improvement in the precision and the probability with which sensing as an abnormality is allowed in abnormality diagnosis (abnormality sensing) in the power transmission mechanism in which noise is frequently large.

Embodiment Example 5

Next, embodiment example 5 of the present invention will be described.

The overall configuration of embodiment example 5 of the present invention is similar to that of embodiment example 1, and therefore illustration and detailed description are omitted.

Embodiment example 5 is an example in which an abnormality such as mixing with foreign matter occurs in the power transmission mechanism and the occurrence of the abnormality and the abnormality place can be sensed. Embodiment example 5 is an example that can be applied in addition to the abnormality sensing in embodiment examples 1 to 4.

Figure 17:
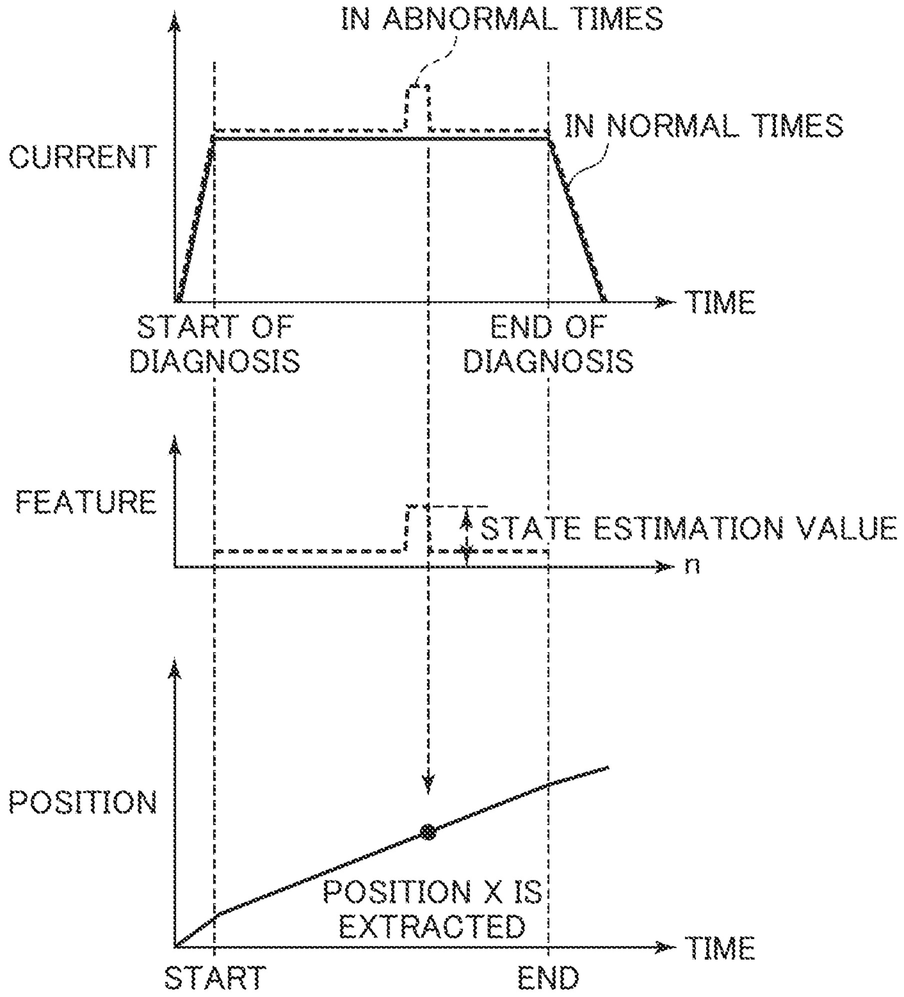
FIG. 17 is a diagram for explaining sensing of an abnormality occurrence position according to the present embodiment.
Figure 18:
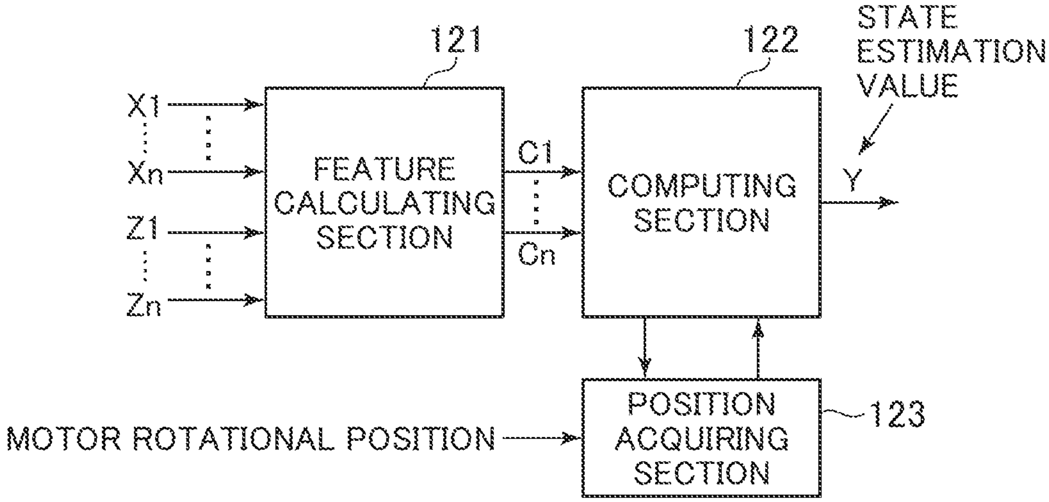
FIG. 18 is a diagram that explains a system configuration for executing the sensing of the abnormality occurrence position according to the present embodiment.

FIG. 17 is a diagram that explains a method for sensing (extracting) an abnormality occurrence position X in the case in which an abnormality has occurred, such as the case in which foreign matter is mixed into the power transmission mechanism. FIG. 18 is a schematic diagram illustrating the functional configuration of the feature calculating section and the computing section in embodiment example 5, and a position acquiring section 123 is added to the example illustrated in FIG. 5. The position acquiring section 123 acquires position information per unit process in which the power transmission mechanism is driven. The position acquiring section 123 acquires the position information of the power transmission mechanism at substantially the same timing as the current acquiring section that is the control internal value creating section 43. Furthermore, the position acquiring section 123 outputs the position corresponding to the unit process when an abnormality of the power transmission mechanism is sensed.

In FIG. 17, in the time from the start of abnormality diagnosis to the end of the diagnosis, in normal times, the current value rises up in an inclined manner and then becomes a constant value, and after keeping the constant value, the current value falls down in an inclined manner, as illustrated by a solid line.

In the time from the start of the abnormality diagnosis to the end of the diagnosis, in the case in which an abnormality such as mixing with foreign matter has occurred, the current value changes in a pulsed manner as illustrated by a dashed line. In this case, similarly to the current waveform in abnormal times, the feature also suddenly rises and thereafter falls down in a short time, as illustrated by a dashed line, when the abnormality such as mixing with foreign matter has occurred. The amount of rise of the feature is a state amount estimation value. Furthermore, the position at which the abnormality such as mixing with foreign matter has occurred corresponds to the timing when the feature has risen up and fallen down between the time position of the rotation start of the motor 13 and the end time. A position X of the motor 13 at this time can be extracted and a position corresponding to it, for example, the position of the screw shaft 17, can be extracted.

As illustrated in FIG. 18, the rotational position of the motor 13 is input to the position acquiring section 123. The feature is output from the computing section 122 to the position acquiring section 123, and the position acquiring section 123 acquires an abnormality position such as a position of mixing with foreign matter on the screw shaft 17 from the rotational position of the motor 13 corresponding to the timing when the feature has risen up or fallen down, and transmits the information on the abnormality position to the computing section 122. The computing section 122 outputs the abnormality occurrence position on the screw shaft 17 to the information transmitting section 45 together with a state amount estimation value Y. The information transmitting section 45 informs the user of the occurrence of an abnormality and the abnormality occurrence position on the screw shaft 17 by display or the like.

Figure 19:
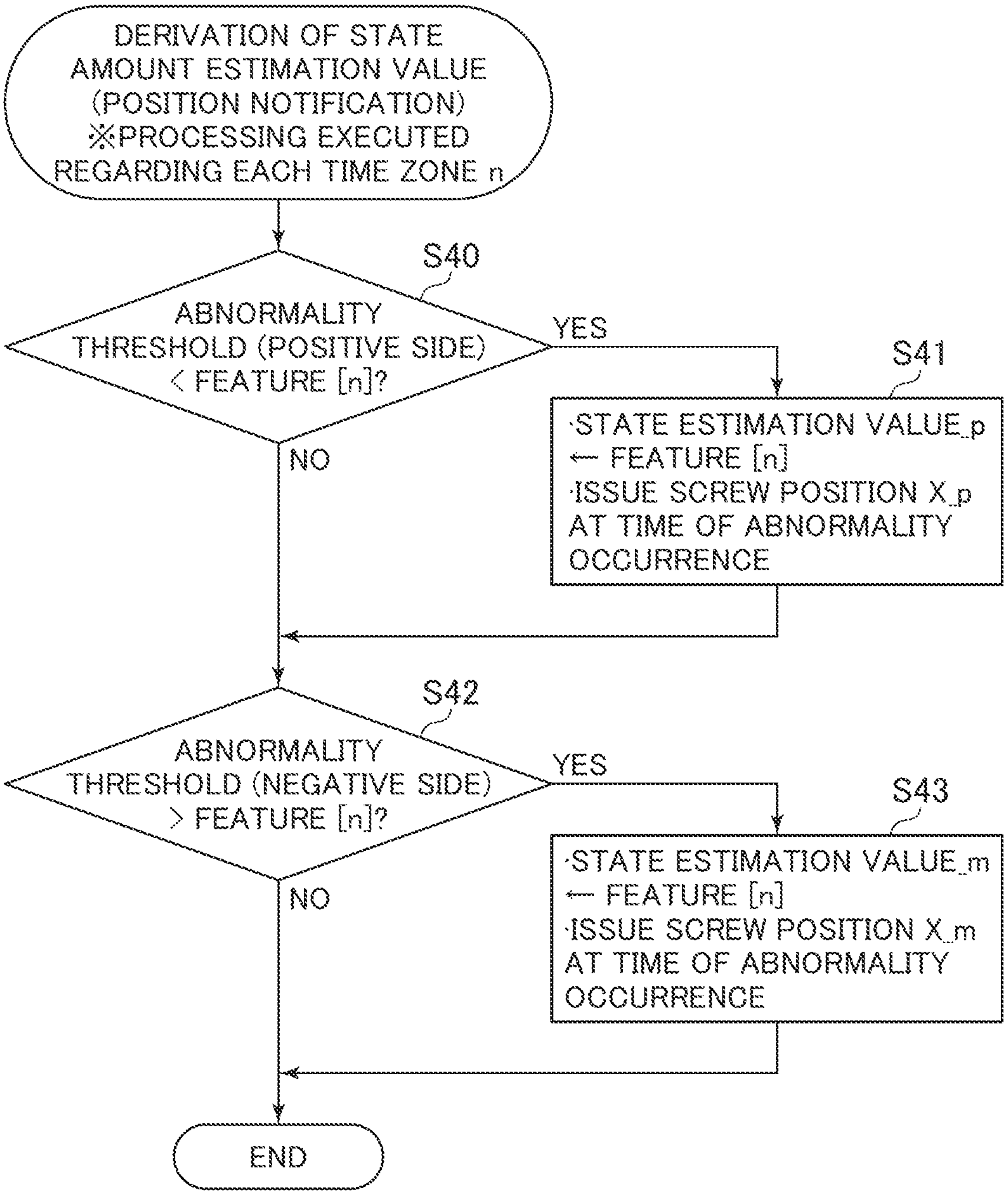
FIG. 19 is a flowchart that explains a method for executing the sensing of the abnormality occurrence position according to the present embodiment.

FIG. 19 is a flowchart that explains a method for executing sensing of the abnormality occurrence position.

In a step S40 in FIG. 19, whether or not the feature is larger than an abnormality threshold (positive side) is determined. When the feature is larger than the abnormality threshold (positive side), in a step S41, the feature is employed as a state amount estimation value p and a position Xp of the screw shaft 17 at the time of abnormality occurrence is issued. Then, the processing proceeds to a step S42. Moreover, when the feature is not larger than the abnormality threshold (positive side) in the step S40, the processing proceeds to the step S42.

In the step S42, whether or not the feature is smaller than an abnormality threshold (negative side) is determined. When the feature is smaller than the abnormality threshold (negative side), in a step S43, the feature is employed as a state amount estimation value m and a position Xm of the screw shaft 17 at the time of abnormality occurrence is issued. Then, the processing is ended. Furthermore, the processing is ended also when the feature is not smaller than the abnormality threshold (negative side) in the step S42.

Also in embodiment example 5 of the present invention, effects similar to those of embodiment examples 1 to 4 can be obtained. In addition, when an abnormality such as mixing with foreign matter has occurred in the power transmission mechanism, the occurrence of the abnormality and the abnormality place can be sensed and issued.

In the above-described embodiment examples 1 to 4, each of the graphs illustrated in FIG. 9, FIG. 10, and FIG. 15 can be displayed on the information transmitting section 45.

Moreover, the present invention can implement a management system including the above-described management device 30 and the power transmission mechanism. The power transmission mechanism in the management system can include the drive pulley 14, the driven pulley 15, the timing belt 16, the ball screw mechanism 20, and the nut part 18. However, the power transmission mechanism applied to the management system of the present invention is not limited to the above-described example and can be applied also to a power transmission mechanism such as a gear mechanism, for example.

Furthermore, it goes without saying that the present invention is not limited to the above-described various configurations and functions, and various kinds of changes and replacement can be made in such a range as not to depart from the gist thereof. For example, the injection molding machine 1 is employed as an application example in the above-described embodiment. However, the present invention can be applied to what transmits power of a motor that is a drive source of a load-side device to load-side equipment through a power transmission mechanism, such as press apparatus and cutting apparatus, as already described.

Moreover, in the above-described embodiment, the deterioration determination based on the feature is executed regarding the screw shaft 17 of the ball screw mechanism 20 as the power transmission mechanism. However, it is also possible to apply the present invention to the deterioration determination of the timing belt 16 or a chain or the like instead of it as the power transmission mechanism.

Furthermore, in the above-described embodiment, the ball screw mechanism 20 is applied as the power transmission mechanism. However, the present invention can be applied also to a screw mechanism composed of a screw bolt and a nut without the interposition of balls.

DESCRIPTION OF REFERENCE CHARACTERS

1: Injection molding machine
11: Injection shaft
12: Mold
13: Motor
14: Pulley
15: Driven pulley
16: Timing belt
17: Screw shaft
18: Nut part
20: Ball screw mechanism
30: Controller (management device)
40: Inverter
41: Motor control section
42: State estimating section
43: Control internal value creating section
44: State calculating section
45: Information transmitting section
46: Motor control updating section
47: External data acquiring section
101: Speed command creating section
102: Torque command creating section
103: Current command creating section
104: Voltage command creating section
105: Two-phase/three-phase transformation section
106: Three-phase/two-phase transformation section
111: Speed command creating section inverse model
112: Torque command creating section inverse model
113: Current command creating section inverse model
114: Voltage command creating section inverse model
115: Three-phase/two-phase transformation section
121: Feature calculating section
122: Computing section (diagnosis section)
123: Position acquiring section
Io: Reference current value

The invention claimed is:

1. A management device for a power transmission mechanism that transmits a driving force from an electric motor to a load-side device, the management device comprising:
- a current acquiring section that acquires a current value of the electric motor per unit process in which the power transmission mechanism is driven;
- a feature calculating section that divides the unit process into a plurality of zones, and calculates an average current value obtained by averaging the current value of each of the zones; and
- a diagnosis section that executes abnormality detection, wherein
- the diagnosis section calculates a state amount estimation value on a basis of the average current value of the plurality of zones and executes abnormality sensing in the unit process on a basis of the state amount estimation value.

2. The management device according to claim 1, wherein
- the diagnosis section calculates, as a feature, a difference between a reference current value serving as a basis and the average current value of each of the zones, a feature that is a maximum average current value in the unit process in a plurality of the features of the zones, defines an average current value having a largest current value difference from the maximum average current value as a feature that is a minimum average current value, and calculates, as the state amount estimation value, an absolute value of difference between the feature that is the maximum average current value and the feature that is the minimum average current value.

3. The management device according to claim 1, wherein the diagnosis section calculates, as a feature, a difference between a reference current value serving as a basis and the average current value of each of the zones, executes classification into a first average current value group with a current value larger than the reference current value and a second average current value group with a current value smaller than the reference current value, and calculates, as the state amount estimation value, an absolute value of difference between an average value of the feature of the first average current value group and the feature of the second average current value group.

4. The management device according to claim 1, wherein the diagnosis section executes classification into a first average current value group about which a difference between a reference current value serving as a basis and the average current value of each of the zones becomes a positive value and a second average current value group about which the difference becomes a negative value, compares number of features of the first average current value group and number of features of the second average current value group with each other, and calculates, as the state amount estimation value, a value of a largest absolute value of difference from the reference current value in the average current value group in which the number of features is larger.

5. The management device according to claim 1, wherein the average current value is equal to or smaller than a positive threshold defined regarding each of the zones and is equal to or larger than a negative threshold.

6. The management device according to claim 1, further comprising:

a position acquiring section that acquires a current value per unit process in which the power transmission mechanism is driven, wherein the position acquiring section acquires position information at a same timing as the current acquiring section, and outputs a position corresponding to the unit process when an abnormality of the power transmission mechanism is sensed.

7. The management device according to claim 1, further comprising:

a display section that displays the average current value.

8. The management device according to claim 1, further comprising:

a display section that displays a graph indicating a relationship between the state amount estimation value and date and time.

9. The management device according to claim 8, wherein the management device displays the state amount estimation value on the display section at an interval of a specified number of days.

10. The management device according to claim 8, wherein the management device averages the state amount estimation values measured a plurality of times in one day and displays the average on the display section as the state amount estimation value of the day.

11. A management method for a power transmission mechanism that transmits a driving force from an electric motor to a load-side device, the management method comprising:

a current acquisition step of acquiring a current value per unit process in which the power transmission mechanism is driven;

an average current value calculation step of dividing the unit process into a plurality of zones, and calculating an average current value obtained by averaging the current value of each of the zones; and an abnormality detection step of executing abnormality detection, wherein the abnormality detection step calculates a state amount estimation value on a basis of the average current value of the plurality of zones and executes abnormality sensing in the unit process on a basis of the state amount estimation value.

12. The management method according to claim 11, wherein the abnormality detection step compares a reference current value serving as a basis and the average current value of each of the zones with each other, calculates an average current value with a largest difference as a feature, a feature that is a maximum average current value in the unit process in a plurality of the features of the zones, defines an average current value having a largest current value difference from the maximum average current value as a feature that is a minimum average current value, and calculates, as the state amount estimation value, an absolute value of difference between the feature that is the maximum average current value and the feature that is the minimum average current value.

13. A management system comprising: the management device according to claim 1; and the power transmission mechanism.

* * * * *